US012765315B2

(12) United States Patent
Narita et al.

(10) Patent No.: US 12,765,315 B2
(45) Date of Patent: Oct. 13, 2026

(54) SUBSTRATE STORAGE CONTAINER AND FILTER UNIT

(71) Applicant: MIRAIAL CO., LTD., Tokyo (JP)

(72) Inventors: Yuya Narita, Tokyo (JP); Tadatoshi Inoue, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 751 days.

(21) Appl. No.: 17/630,769

(22) PCT Filed: Jul. 29, 2020

(86) PCT No.: PCT/JP2020/029110
§ 371 (c)(1),
(2) Date: Jan. 27, 2022

(87) PCT Pub. No.: WO2021/020460
PCT Pub. Date: Feb. 4, 2021

(65) Prior Publication Data

US 2022/0199439 A1 Jun. 23, 2022

(30) Foreign Application Priority Data

Jul. 30, 2019 (WO) .................. PCT/JP2019/029897
Jul. 30, 2019 (WO) .................. PCT/JP2019/029898

(51) Int. Cl.
*H10P 72/10* (2026.01)

(52) U.S. Cl.
CPC ...... *H10P 72/1922* (2026.01); *H10P 72/1916* (2026.01); *H10P 72/1921* (2026.01)

(58) Field of Classification Search
CPC ......... H01L 21/67386; H01L 21/67393; H01L 21/67376; H10P 72/1922; H10P 72/1916;
(Continued)

(56) References Cited

U.S. PATENT DOCUMENTS 5,103,857 A 4/1992 Kuhn et al.
9,091,353 B2 * 7/2015 Lo ......................... F16K 15/026
(Continued)

FOREIGN PATENT DOCUMENTS

JP 2002521189 A 7/2002
JP 4201583 B2 12/2008
(Continued)

OTHER PUBLICATIONS

Office Action issued Jul. 9, 2024 in the KR Patent Application No. 10-2022-7001287; pp. 1-16.
(Continued)

*Primary Examiner* — Orlando E Aviles
*Assistant Examiner* — Jenine Spicer
(74) *Attorney, Agent, or Firm* — MUNCY, GEISSLER, OLDS & LOWE, P.C.

(57) ABSTRACT

A housing accommodates: a valve body capable of moving between a closing position and an opening position in an outer opening portion, the closing position closing the outer opening portion and the opening position opening the outer opening portion; a biased member having a tubular shape and connected to the valve body, the biased member supported by the housing so as to be movable in the housing and guiding the movement of the valve body so as to move integrally with the valve body; and a biasing member biasing the biased member so that the valve body moves to the closing position.

42 Claims, 14 Drawing Sheets

(58) Field of Classification Search
CPC ............. H10P 72/1921; H10P 72/1926; H10P 72/1918; H10P 72/1914; H10P 72/19; B01D 46/42; F16K 15/025; F16K 27/0209; F16K 47/02
USPC .......................................................... 206/711
See application file for complete search history.

(56) References Cited

U.S. PATENT DOCUMENTS

| | | | | |
|---|---|---|---|---|
| 2005/0077204 | A1* | 4/2005 | Sumi | H01L 21/67379 206/710 |
| 2005/0139267 | A1 | 6/2005 | Chen et al. | |
| 2006/0266011 | A1* | 11/2006 | Halbmaier | H01L 21/67017 55/385.6 |
| 2009/0260331 | A1* | 10/2009 | Pan | H01L 21/67393 220/361 |
| 2009/0266441 | A1* | 10/2009 | Sato | F16K 15/063 141/98 |
| 2018/0247846 | A1 | 8/2018 | Murata et al. | |
| 2021/0148479 | A1* | 5/2021 | Ogawa | F16K 17/18 |

FOREIGN PATENT DOCUMENTS

| | | | |
|---|---|---|---|
| JP | 2008297046 | A | 12/2008 |
| JP | 2009277687 | A | 11/2009 |
| JP | 2010267761 | A | 11/2010 |
| JP | 2010270823 | A | 12/2010 |
| JP | 4859065 | B2 | 1/2012 |
| JP | 2017147372 | A | 8/2017 |
| JP | 2017188609 | A | 10/2017 |
| JP | 2018505546 | A | 2/2018 |
| JP | 2019021717 | A | 2/2019 |
| WO | WO-2000006286 | A1 | 2/2000 |
| WO | WO-2015132910 | A1 | 9/2015 |
| WO | WO-2016002005 | A1 | 1/2016 |
| WO | WO-2016089912 | A1 | 6/2016 |
| WO | WO-2017033546 | A1 | 3/2017 |

OTHER PUBLICATIONS

Notification of Reasons for Refusal Issued Mar. 5, 2025 in JP Patent Application No. 2021-535395 (Machine Translation).

* cited by examiner

SUBSTRATE STORAGE CONTAINER AND FILTER UNIT

TECHNICAL FIELD

The present invention relates to a substrate storing container used when storing, keeping, transferring, and transporting a substrate made up of a semiconductor wafer or the like, and to a filter unit provided for the substrate storing container.

BACKGROUND ART

Conventionally, as for substrate storing containers for storing substrates made up of semiconductor wafers and transferring in and between steps in a factory, containers having a configuration that includes a container main body and a lid body have been known (for example, see Patent Documents 1 to 6).

One end portion of the container main body has an opening circumferential portion with a container main body opening portion formed. The other end portion of the container main body has a blocked tubular wall portion. A substrate storage space is formed in the container main body. The substrate storage space is surrounded by the wall portion and can store substrates. The lid body can be attached to and detached from the opening circumferential portion and is capable of blocking the container main body opening portion. Side substrate support portions are provided in the wall portion so as to make a pair in the substrate storage space. The side substrate support portions are capable of supporting the edge portions of substrates in a state where the adjacent substrates are separated from each other at a predetermined interval and arranged in parallel when the container main body opening portion is not blocked by the lid body.

A front retainer is provided at the part of the lid body that faces the substrate storage space when the container main body opening portion is blocked. The front retainer is capable of supporting the edge portions of the substrates when the container main body opening portion is blocked by the lid body. A back side substrate support portion is provided in the wall portion so as to make a pair with the front retainer. The back side substrate support portion is capable of supporting the edge portions of the substrates. When the container main body opening portion is blocked by the lid body, the back side substrate support portion supports the substrates in cooperation with the front retainer. As a result, the back side substrate support portion retains the substrates in a state where the adjacent substrates are separated from each other at a predetermined interval and arranged in parallel.

In addition, the container main body is provided with check valves. Through the check valves, from the outside of the container main body to the substrate storage space, gas purge is performed with inert gas, such as nitrogen, or dry air (hereinafter called purge gas) from which moisture has been removed (1% or less). The check valves prevent leakage of gas with which the substrate storage space is filled by the gas purge. The check valves are respectively provided with filters. The filters remove particles, organic matters, moisture and the like that are included in air flowing through the filter from the outside of the container main body.

Aeration ports respectively provided with check valves are classified into injection holes and exhaust holes and used. The role of the exhaust holes for effectively replacing the injected purge gas is important. However, as the case now stands, the purge gas sometimes leaks through a sealing member (gasket) provided for the lid body engaged with the container main body opening portion. Also in terms of safety and environment, it is becoming an important problem how to discharge the injected purge gas through the exhaust holes.

Valve units that are conventional check valves on the exhaust hole side have a structure of opening by the internal pressure of the substrate storing container. Since springs are used for opening and closing valves, the pressure for contracting springs serves as resistance against discharge of gas, and is a cause of leaking of the purge gas through the sealing member provided for the lid body. Accordingly, the springs used on the exhaust side are required to operate at a low pressure.

When the substrate storing container is used in a factory, the substrate storing container is cleaned. A valve seal of the valve unit resides on the inner side of the tubular shaped portion in the unit. On the outside air side of the seal, an expansion and contraction space for the spring is required. There occurs a problem in that washing water enters the expansion and contraction space for the spring from the opening portion on the outside air side, and resultantly a complete dried state cannot be achieved and water remains in the expansion and contraction space for the spring. Conventional techniques addressing such a problem are described in Patent Documents 5 and 6.

Patent Document 1: Japanese Unexamined Patent Application, Publication No. 2019-021717
Patent Document 2: Japanese Unexamined Patent Application, Publication No. 2017-188609
Patent Document 3: Japanese Unexamined Patent Application (Translation of PCT Application), Publication No. 2018-505546
Patent Document 4: Japanese Patent No. 4859065
Patent Document 5: Japanese Unexamined Patent Application (Translation of PCT Application), Publication No. 2002-521189
Patent Document 6: Japanese Patent No. 4201583

DISCLOSURE OF THE INVENTION

Problems to be Solved by the Invention

As filter units constituting check valves, an air supply filter unit and an exhaust filter unit are adopted. A substrate storing container has a plurality of access communication portions allowing communication between the outside of the container and the inside of the container in order to inject gas from the outside of the container. A filter housing of a filter unit is attached to each access communication portion. In the housing, a check valve and an elastic member (spring) are arranged in order to regulate the flow of gas in one direction.

For efficient injection and discharge of purge gas into and from the filter unit, the check valve and the elastic member are required to reduce the resistance of gas communication as much as possible. On the other hand, since contaminants and particles adhere to the inside of the container, for the sake of maintaining the cleanliness and performance, a cleaning apparatus is periodically used to clean the substrate storing container with washing water. As an adverse effect of reducing the resistance of the check valve and the elastic member described above, a problem occurs where the washing water enters the injection holes owing to the hydraulic pressure during container cleaning and to the wind pressure during drying after cleaning and a long time is required for drying.

There is another problem with the conventional filter unit in that what is called chattering noise is caused by slight opening of the valve body and subsequent quick closing of the valve body due to the difference in pressure at the valve body as a boundary, which are repeated in a short time.

To efficiently perform gas purge with purge gas injected into the container storage space, the role of the exhaust filter unit is important. Furthermore, it is important to securely recover, from the exhaust filter unit, the purge gas injected into the container storage space, in terms of safety and environment in a factory.

When such a substrate storing container including the exhaust filter units is used in a factory, the substrate storing container is cleaned with washing water. There is however a problem in that in the conventional exhaust filter unit, the washing water easily enters the inside of the filter unit from the opening and resultantly the washing water is not dried up and remains after cleaning. For sufficient drying, the exhaust filter units are required to be detached from the container main body. There is a problem of taking a long time for this operation.

It is conceivable that according to the structure described in Patent Document 5, during repetitive valve opening and closing, the axis of the valve body sometimes deviates so that the valve body included in the valve shakes its head, and causes faulty sealing and leaking.

The structure described in Patent Document 6 is resistant to occurrence of faulty sealing due to deviation of the axis, but it is conceivable that a problem occurs in that washing water easily enters from the opening portion on the outside air side. An O-ring is required to be pressed with planes. Accordingly, a spring as an elastic body having a high spring constant to some extent is required to be selected. A problem is conceivable where such selection reduces the efficiency of purge gas discharge.

The present invention has an object to provide a substrate storing container including a filter unit and the filter unit that are resistant to intrusion of washing water into the filter unit and can suppress occurrence of what is called chattering noise, or a substrate storing container including a filter unit and the filter unit that can efficiently perform gas purge with purge gas injected into a container storage space, or a substrate storing container including a filter unit and the filter unit that can suppress leakage of the purge gas and suppress reduction in efficiency in discharge of the purge gas.

Means for Solving the Problems

The present invention relates to a substrate storage container that includes: a container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion; and a lid body that can be attached to and detached from the opening circumferential portion, and can block the container main body opening portion in a positional relationship of being surrounded by the opening circumferential portion; a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body; a filter unit that includes a ventilation path allowing communication between the substrate storage space and a space outside of the container main body, a filter disposed on the ventilation path and a housing that forms the ventilation path, is disposed in the container main body, and allows gas to pass between the space outside of the container main body and the substrate storage space through the filter; and an outward opening portion that is included in the housing and is opened toward the space outside of the container main body, the housing accommodating a valve body that blocks the outward opening portion by being inserted into this outward opening portion, and opens the outward opening portion by being removed from this outward opening portion.

Preferably, an opening area of the ventilation path at an opening end thereof opening toward the space outside of the container main body is larger than an opening area at the outward opening portion into which the valve body is inserted.

Preferably, the housing includes: an outer housing portion; and an inner housing portion that is disposed in the outer housing portion and is supported by the outer housing portion movably with respect to this outer housing portion, and the inner housing portion includes the outward opening portion.

Preferably, the valve body includes a valve body main body, and a convex portion that projects from the valve body main body and is inserted into the outward opening portion.

Preferably, a part of the valve body main body around the convex portion constitutes a sealing portion, the inner housing portion includes a tubular shaped portion that includes an inner peripheral sliding face on which the valve body main body is slide to support the valve body main body, and a part of the inner housing portion around the outward opening portion constitutes a valve seat against which the sealing portion abuts.

Preferably, a height of the convex portion in a projecting direction is identical to a length of the outward opening portion in a penetrating direction thereof or larger than the length of the outward opening portion in the penetrating direction.

Preferably, the valve body main body includes a rib-shaped portion that directly abuts against and is slid on the inner peripheral sliding face.

Preferably, the filter unit includes an urging member that urges the valve body in a direction of insertion into the outward opening portion.

The present invention relates to a filter unit disposed in a container main body of a substrate storing container that includes: the container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion and; a lid body that can be attached to and detached from the opening circumferential portion, and can block the container main body opening portion in a positional relationship of being surrounded by the opening circumferential portion; a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body; a filter disposed on the ventilation path allowing communication between the substrate storage space and a space outside of the container main body; and a housing that forms the ventilation path, and an outward opening portion that is included in the housing and is opened toward the space outside of the container main body, the housing accommodating a valve body that blocks the outward opening portion by being inserted into this outward opening portion, and opens the outward opening portion by being removed from this outward opening portion, the filter unit allowing gas to pass between the space outside of the container main body and the substrate storage space through the filter.

Preferably, an opening area of the outward opening portion at an opening end thereof opening toward the space outside of the container main body is larger than an opening area at the outward opening portion into which the valve body is inserted.

Preferably, the housing includes: an outer housing portion; and an inner housing portion that is disposed in the outer housing portion and is supported by the outer housing portion movably with respect to this outer housing portion, and the inner housing portion includes the outward opening portion.

Preferably, the valve body includes a valve body main body, and a convex portion that projects from the valve body main body and is inserted into the outward opening portion.

Preferably, a part of the valve body main body around the convex portion constitutes a sealing portion, the inner housing portion includes a tubular shaped portion that includes an inner peripheral sliding face on which the valve body main body is slide to support the valve body main body, and a part of the inner housing portion around the outward opening portion constitutes a valve seat against which the sealing portion abuts.

Preferably, a height of the convex portion in a projecting direction is identical to a length of the outward opening portion in a penetrating direction thereof or larger than the length of the outward opening portion in the penetrating direction.

Preferably, the valve body main body includes a rib-shaped portion that directly abuts against and is slid on the inner peripheral sliding face.

Preferably, the filter unit includes an urging member that urges the valve body in a direction of insertion into the outward opening portion.

The present invention relates to a substrate storing container that includes: a container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion and; a lid body that can be attached to and detached from the opening circumferential portion, and can block the container main body opening portion in a positional relationship of being surrounded by the opening circumferential portion; a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body; and a filter unit that includes a ventilation path allowing communication between the substrate storage space and a space outside of the container main body, a filter disposed on the ventilation path and a housing that forms the ventilation path, is disposed in the container main body, and allows gas to pass between the space outside of the container main body and the substrate storage space through the filter, the filter unit including: an exhaust filter unit that allows gas to flow from the substrate storage space to the space outside of the container main body; and an air supply filter unit that allows gas to flow from the space outside of the container main body to the substrate storage space, the housing of the exhaust filter unit includes an outward opening portion opened toward the space outside of the container main body, the housing of the exhaust filter unit accommodating: a valve body that is inserted into the outward opening portion and is movable between a blocked position of blocking the outward opening portion and an open position of opening the outward opening portion in this outward opening portion; an urged member that is connected to the valve body, is supported by the housing of the exhaust filter unit movably in the housing of the exhaust filter unit, and guides movement of the valve body; and an urging member that urges the urged member so as to move the valve body to the blocked position, the substrate storing container having an effective area of the filter of the exhaust filter unit is larger than an effective area of the filter of the air supply filter unit.

Preferably, the valve body is made of an elastically deformable material. Preferably, the valve body is fixed to the urged member in an attachable and detachable manner. Preferably, a gas flow path allowing gas to flow therethrough is formed in the urged member. Preferably, the urging member is made up of a spring, and a diameter of the spring is larger than a diameter of the outward opening portion.

Preferably, the housing includes: an outer housing portion; and an inner housing portion that is disposed in the outer housing portion and is supported by the outer housing portion movably with respect to this outer housing portion, and the inner housing portion includes the outward opening portion.

Preferably, the urged member includes an urged member main body portion that includes a valve body fixation portion to which the valve body is fixed, and the inner housing portion includes: a tubular shaped portion that includes an inner peripheral sliding face on which the urged member main body portion is slid and this urged member main body portion is supported; and an outward opening portion forming portion integrally formed with the tubular shaped portion.

Preferably, the outward opening portion has a flared shape with a diameter increasing toward the space outside of the container main body, the valve body includes a through-hole block portion that blocks the outward opening portion at the blocked position, and an outer peripheral face of the through-hole block portion has a flared shape with a diameter increasing toward the space outside of the container main body, and a flare rate of the outer peripheral face of the through-hole block portion per unit length in an axial direction of the through-hole block portion is higher than a flare rate of the outward opening portion per unit length in an axial direction of the outward opening portion.

The present invention relates to a substrate storing container that includes: a container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion and; a lid body that can be attached to and detached from the opening circumferential portion, and can block the container main body opening portion in a positional relationship of being surrounded by the opening circumferential portion; a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body; a filter unit that includes a ventilation path allowing communication between the substrate storage space and a space outside of the container main body; a filter disposed on the ventilation path is disposed in the container main body, and allows gas to pass between the space outside of the container main body and the substrate storage space through the filter; a housing that forms the ventilation path; and an outward opening portion that is included in the housing and is opened toward the space outside of the container main body, the housing accommodating: a valve body that is inserted into the outward opening portion and is movable between a blocked position of blocking the outward opening portion and an open position of opening the outward opening portion in this outward opening portion; an urged member that has a tubular shape, is connected to the valve body, is supported and guided by the housing movably in the housing, and guides movement of the valve body so as to move integrally with the valve body; and an urging member that urges the urged member so as to move the valve body to the blocked position.

Preferably, the valve body is made of an elastically deformable material. Preferably, an O-ring is provided on a circumferential portion of the valve body. Preferably, the valve body is fixed to the urged member in an attachable and detachable manner. Preferably, a gas flow path allowing gas to flow therethrough is formed in the urged member. Preferably, the urging member is made up of a spring, and a diameter of the spring is larger than a diameter of the outward opening portion.

Preferably, the housing includes: an outer housing portion; and an inner housing portion that is disposed in the outer housing portion and is supported by the outer housing portion movably with respect to this outer housing portion, and the inner housing portion includes the outward opening portion.

Preferably, the urged member includes an urged member main body portion that includes a valve body fixation portion to which the valve body is fixed, and the inner housing portion includes: a tubular shaped portion that includes an inner peripheral sliding face on which the urged member main body portion is slid and this urged member main body portion is supported; and an outward opening portion forming portion integrally formed with the tubular shaped portion.

Preferably, the outward opening portion has a flared shape with a diameter increasing toward the space outside of the container main body, the valve body includes a through-hole block portion that blocks the outward opening portion at the blocked position, and an outer peripheral face of the through-hole block portion has a flared shape with a diameter increasing toward the space outside of the container main body, and a flare rate of the outer peripheral face of the through-hole block portion per unit length in an axial direction of the through-hole block portion is higher than a flare rate of the outward opening portion per unit length in an axial direction of the outward opening portion.

The present invention relates to a filter unit disposed in a container main body of a substrate storing container that includes: the container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion; and a lid body that can be attached to and detached from the opening circumferential portion, and can block the container main body opening portion in a positional relationship of being surrounded by the opening circumferential portion; a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body; a filter disposed on a ventilation path allowing communication between the substrate storage space and a space outside of the container main body; a housing that forms the ventilation path; and an outward opening portion that is included in the housing and is opened toward the space outside of the container main body, the housing accommodating: a valve body that is inserted into the outward opening portion and is movable between a blocked position of blocking the outward opening portion and an open position of opening the outward opening portion in this outward opening portion; an urged member that has a tubular shape, is connected to the valve body, is supported and guided by the housing movably in the housing, and guides movement of the valve body so as to move integrally with the valve body; and an urging member that urges the urged member so as to move the valve body to the blocked position.

Preferably, the valve body is made of an elastically deformable material. Preferably, an O-ring is provided on a circumferential portion of the valve body. Preferably, the valve body is fixed to the urged member in an attachable and detachable manner. Preferably, a gas flow path allowing gas to flow therethrough is formed in the urged member. Preferably, the urging member is made up of a spring, and a diameter of the spring is larger than a diameter of the outward opening portion.

Preferably, the housing includes: an outer housing portion; and an inner housing portion that is disposed in the outer housing portion and is supported by the outer housing portion movably with respect to this outer housing portion, and the inner housing portion includes the outward opening portion.

Preferably, the urged member includes an urged member main body portion that includes a valve body fixation portion to which the valve body is fixed, and the inner housing portion includes: a tubular shaped portion that includes an inner peripheral sliding face on which the urged member main body portion is slid and this urged member main body portion is supported; and an outward opening portion forming portion integrally formed with the tubular shaped portion.

Preferably, the outward opening portion has a flared shape with a diameter increasing toward the space outside of the container main body, the valve body includes a through-hole block portion that blocks the outward opening portion at the blocked position, and an outer peripheral face of the through-hole block portion has a flared shape with a diameter increasing toward the space outside of the container main body, and a flare rate of the outer peripheral face of the through-hole block portion per unit length in an axial direction of the through-hole block portion is higher than a flare rate of the outward opening portion per unit length in an axial direction of the outward opening portion.

Effects of the Invention

The present invention has an object to provide a substrate storing container including a filter unit and the filter unit that are resistant to intrusion of washing water into the filter unit, or a substrate storing container including a filter unit and the filter unit that can efficiently perform gas purge with purge gas injected into the container storage space, or a substrate storing container including a filter unit and the filter unit that can suppress leakage of the purge gas and suppress reduction in efficiency in discharge of the purge gas.

PREFERRED MODE FOR CARRYING OUT THE INVENTION

Figure 1:
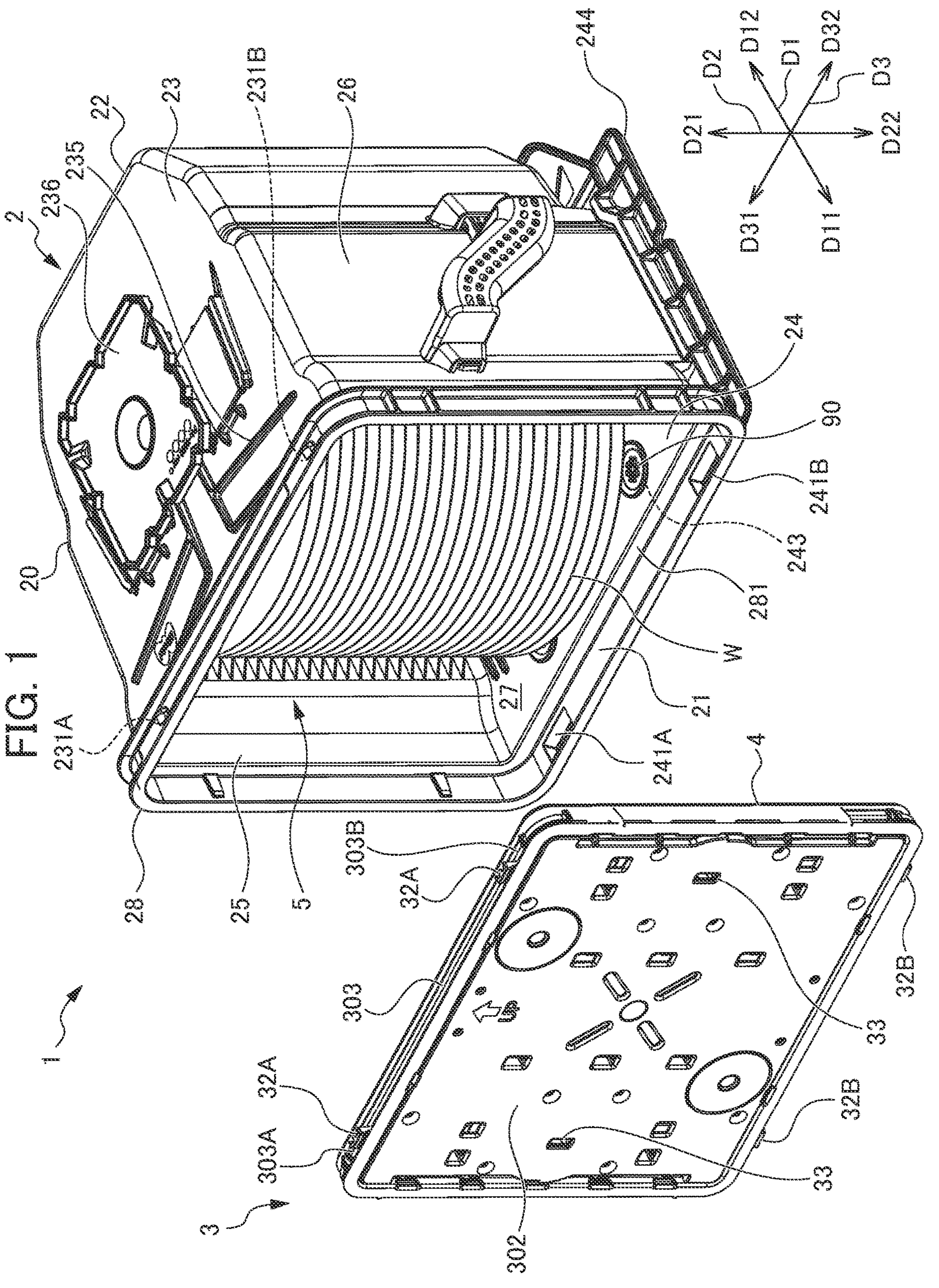
FIG. 1 is an exploded perspective view illustrating a state where a plurality of substrates W are stored in a substrate storing container 1 according to a first embodiment of the present invention.
Figure 2:
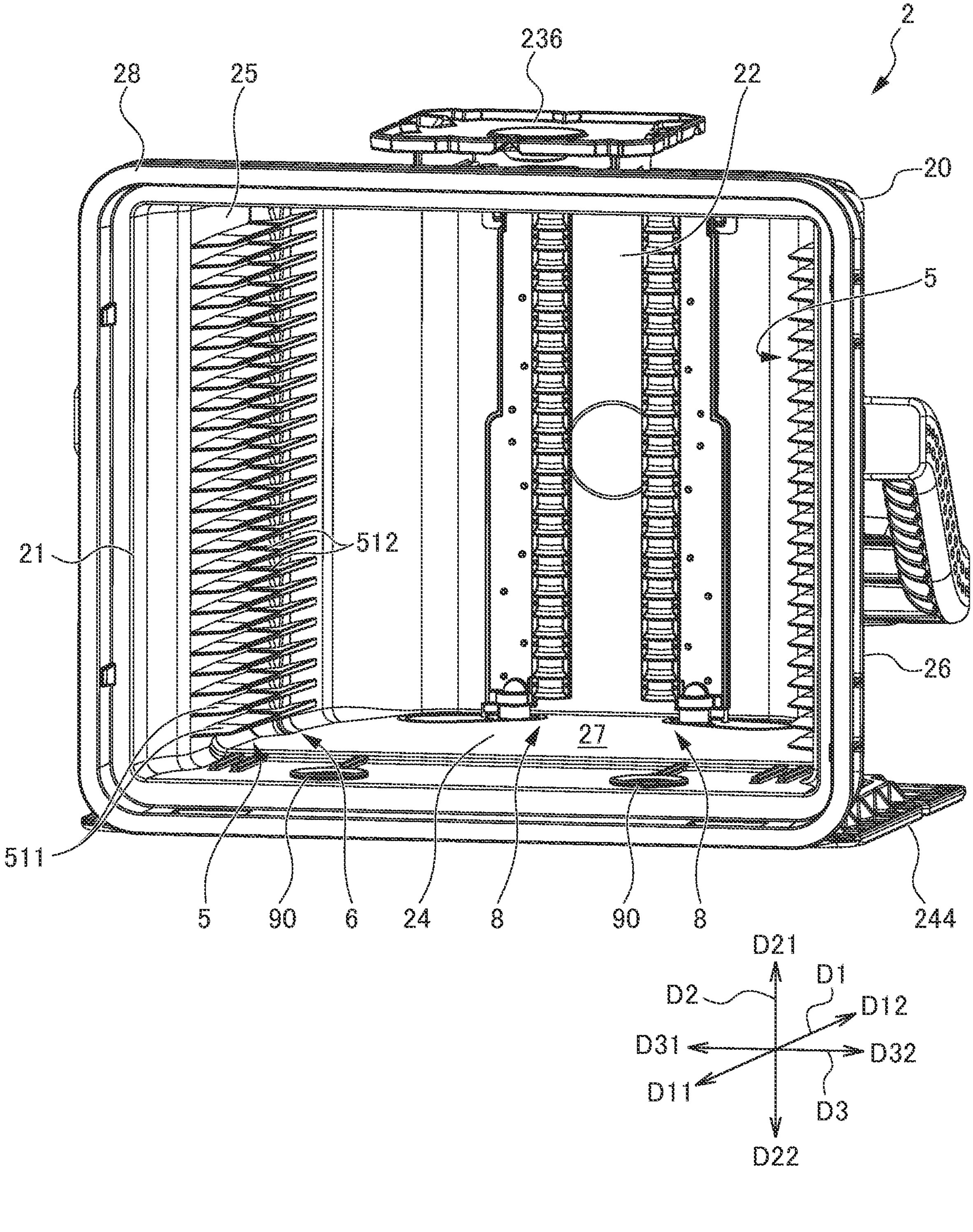
FIG. 2 is an upper perspective view illustrating a container main body 2 of the substrate storing container 1 according to the first embodiment of the present invention.
Figure 3:
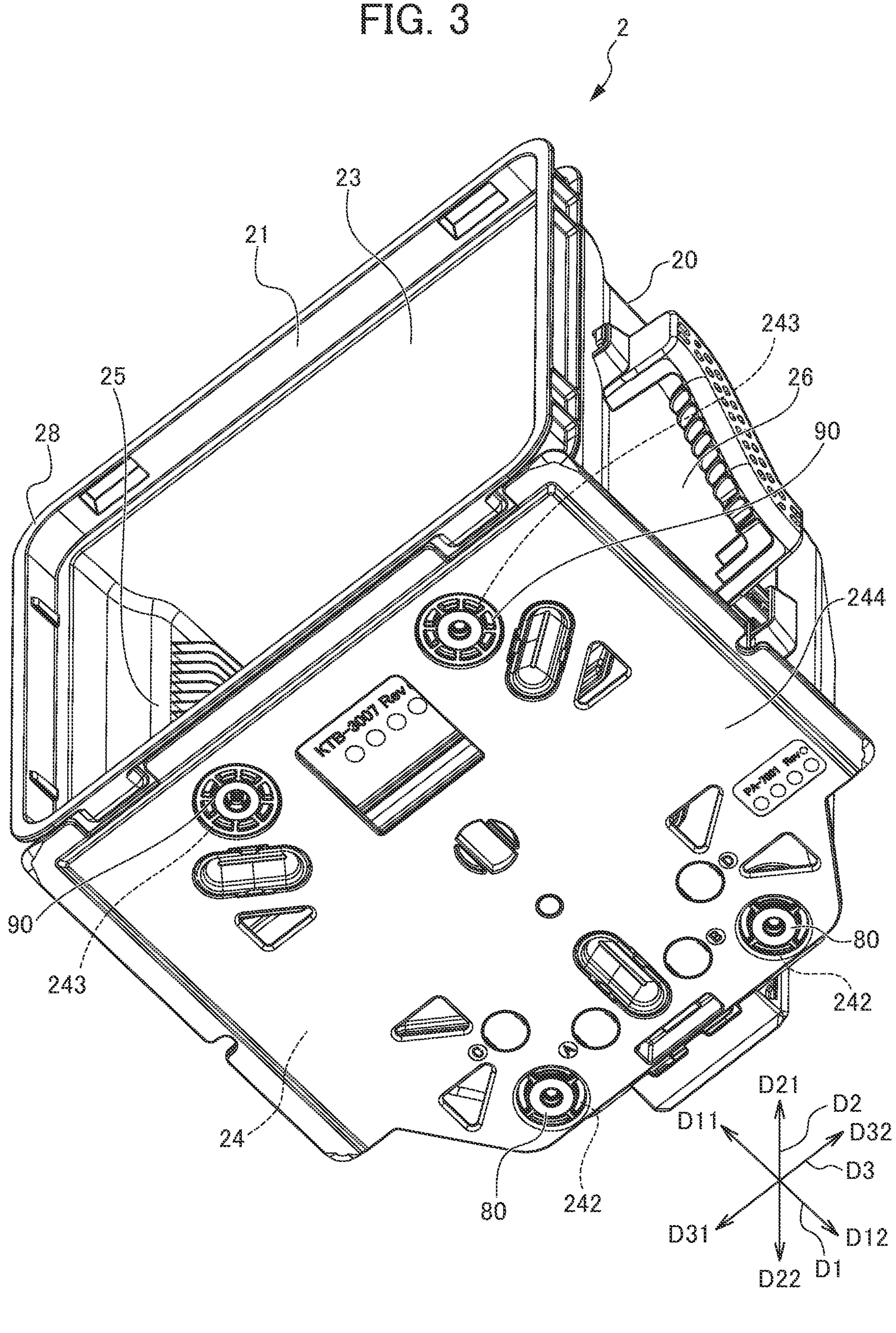
FIG. 3 is a lower perspective view illustrating the container main body 2 of the substrate storing container 1 according to the first embodiment of the present invention.
Figure 4:
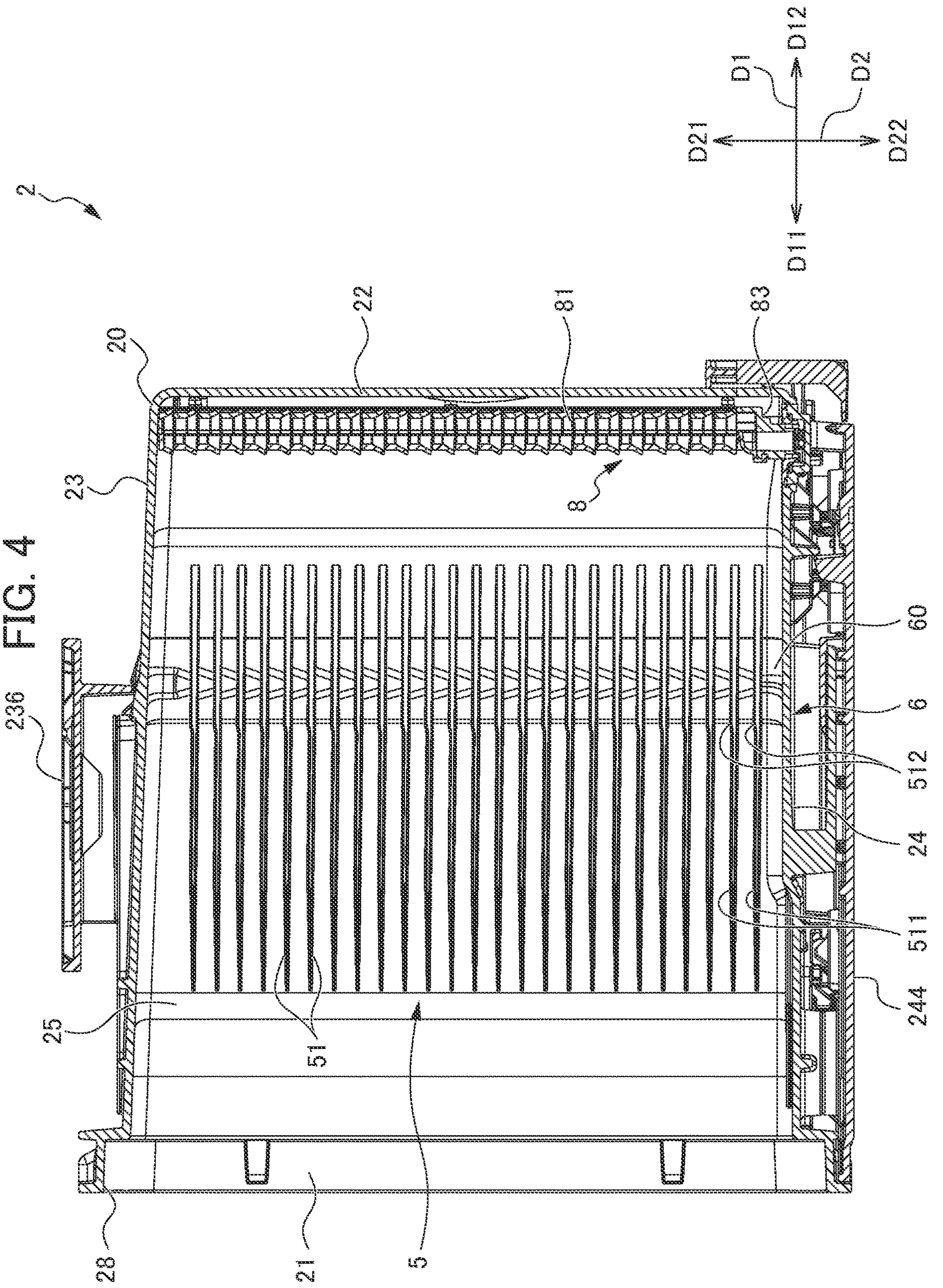
FIG. 4 is a side sectional view illustrating the container main body 2 of the substrate storing container 1 according to the first embodiment of the present invention.

Hereinafter, a substrate storing container 1 according to the present embodiment will be described with reference to the drawings. FIG. 1 is an exploded perspective view illustrating a state where a plurality of substrates W are stored in the substrate storing container 1. FIG. 2 is an upper perspective view illustrating a container main body 2 of the substrate storing container 1. FIG. 3 is a lower perspective view illustrating the container main body 2 of the substrate storing container 1. FIG. 4 is a side sectional view illustrating the container main body 2 of the substrate storing container 1.

Here, for convenience of description, the direction from the container main body 2 (described later) toward a lid body 3 (direction from the upper right toward the lower left in FIG. 1) is defined as the forward direction D11, the direction opposite to the forward direction is defined as the backward direction D12, and the forward and backward directions are collectively defined as the forward/backward direction D1. In addition, the direction from a lower wall 24 (described later) toward an upper wall 23 (upper direction in FIG. 1) is defined as the upper direction D21, the direction opposite to the upper direction is defined as the lower direction D22, and the upper and lower directions are collectively defined as the upper/lower direction D2. In addition, the direction from a second side wall 26 (described later) toward a first side wall 25 (direction from the lower right toward the upper left in FIG. 1) is defined as the left direction D31, the direction opposite to the left direction is defined as the right direction D32, and the left and right directions are collectively defined as the left/right direction D3. The main drawings illustrate arrows indicating these directions.

In addition, the substrate W (see FIG. 1) stored in the substrate storing container 1 is a disk-shaped silicon wafer, a disk-shaped glass wafer, a disk-shaped sapphire wafer, or the like, is thin, and is used in industries. The substrate W in the present embodiment is a silicon wafer having a diameter of 300 mm.

As illustrated in FIG. 1, the substrate storing container 1 stores the substrates W made of silicon wafers described above and is used as an in-process container for transferring the substrates W in a process in a factory and used as a shipping container for transporting a substrate by means of transport such as means of transport by land, air, and sea. The substrate storing container 1 includes a container main body 2 and a lid body 3. The container main body 2 includes substrate support plate-like portions 5 as side substrate support portions, and a back side substrate support portion 6 (see FIG. 2 etc.). The lid body 3 includes a front retainer (not illustrated) as a lid body side substrate support portion.

The container main body 2 has a tubular wall portion 20. A container main body opening portion 21 is formed in one end portion of the wall portion 20. The other end portion of the wall portion 20 is blocked. A substrate storage space 27 is formed in the container main body 2. The substrate storage space 27 is formed so as to be surrounded by the wall portion 20. The substrate support plate-like portion 5 is disposed at the part of the wall portion 20 that forms the substrate storage space 27. A plurality of the substrates W can be stored in the substrate storage space 27 as illustrated in FIG. 1.

The substrate support plate-like portions 5 are provided in the wall portion 20 so as to make a pair in the substrate storage space 27. The substrate support plate-like portion 5 is capable of supporting the edge portions of substrates W in a state where the adjacent substrates W are separated from each other at a predetermined interval and arranged in parallel by abutting against the edge portions of the substrates W when the container main body opening portion 21 is not blocked by the lid body 3. The back side substrate support portion 6 is provided by being integrally molded with the substrate support plate-like portions 5 on the back side of the substrate support plate-like portions 5.

The back side substrate support portion 6 (see FIG. 2 etc.) is provided in the wall portion 20 so as to make a pair with the front retainer (described later, not illustrated) in the substrate storage space 27. The back side substrate support portion 6 is capable of supporting the rear portions of the edge portions of the plurality of substrates W by abutting against the edge portions of the plurality of substrates W when the container main body opening portion 21 is blocked with the lid body 3.

The lid body 3 can be attached to and detached from an opening circumferential portion 28 (FIG. 1 etc.) forming the container main body opening portion 21 and is capable of blocking the container main body opening portion 21. The front retainer (not illustrated) is provided at the part of the lid body 3 that faces the substrate storage space 27 when the container main body opening portion 21 is blocked by the lid body 3. The front retainer is disposed so as to make a pair with the back side substrate support portion 6 in the substrate storage space 27.

When the container main body opening portion 21 is blocked by the lid body 3, the front retainer is capable of supporting the front portions of the edge portions of the plurality of substrates W by abutting against the edge portions of the plurality of substrates W. When the container main body opening portion 21 is blocked by the lid body 3, the front retainer retains the plurality of substrates W in a state where the adjacent substrates W are separated from each other at a predetermined interval and arranged in parallel by supporting the plurality of substrates W in cooperation with the back side substrate support portion 6.

A resin such as a plastic material constitutes the substrate storing container 1. Unless otherwise specified, examples of the resin of the material include thermoplastic resins such as polycarbonates, cycloolefin polymers, polyetherimide, polyetherketone, polybutylene terephthalate, polyether ether ketone, and liquid crystal polymers and alloys thereof. A conductive substance such as a carbon fiber, carbon powder, a carbon nanotube, and a conductive polymer is selectively added to the resins of the molding materials in a case where conductivity is to be added. It is also possible to add a glass fiber, a carbon fiber, or the like for the purpose of rigidity enhancement.

Figure 5:
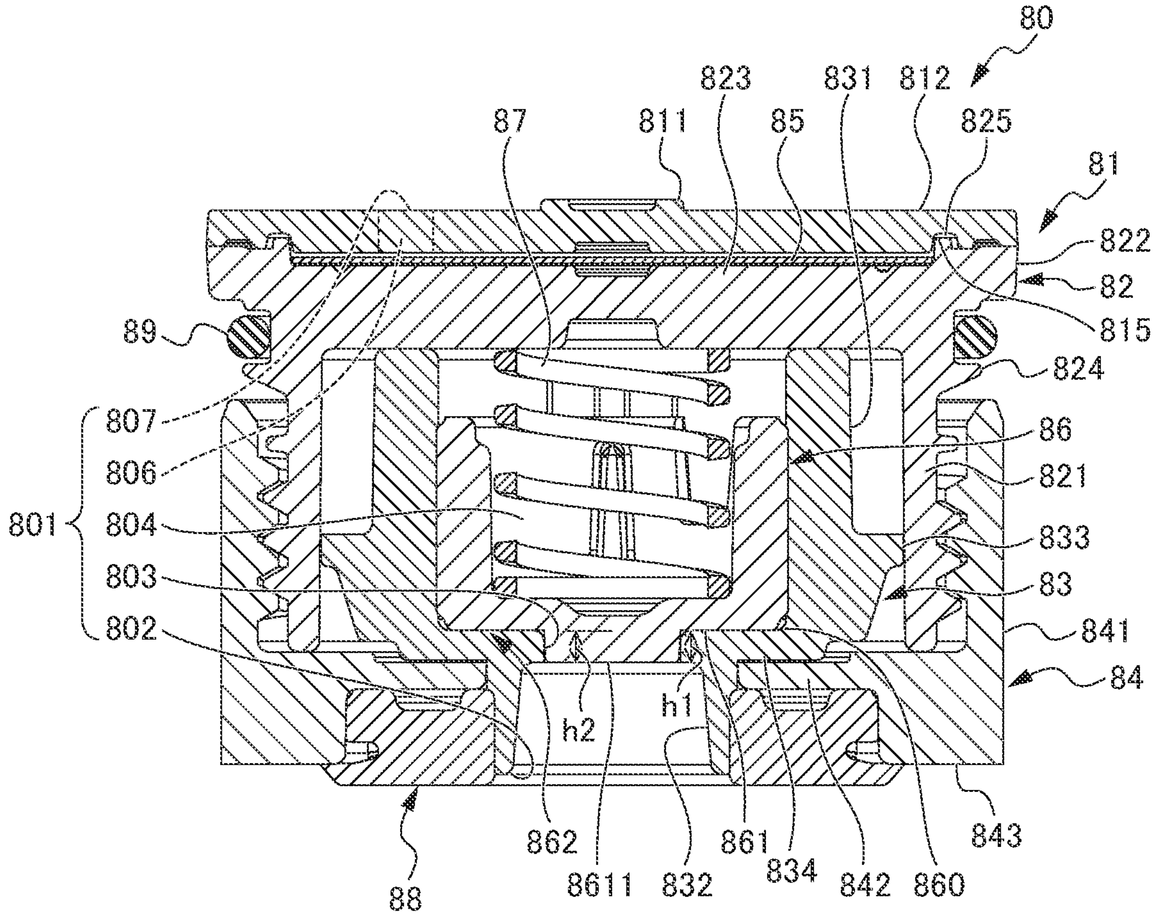
FIG. 5 is a side sectional view illustrating an air supply filter unit 80 of the substrate storing container 1 according to the first embodiment of the present invention.
Figure 6:
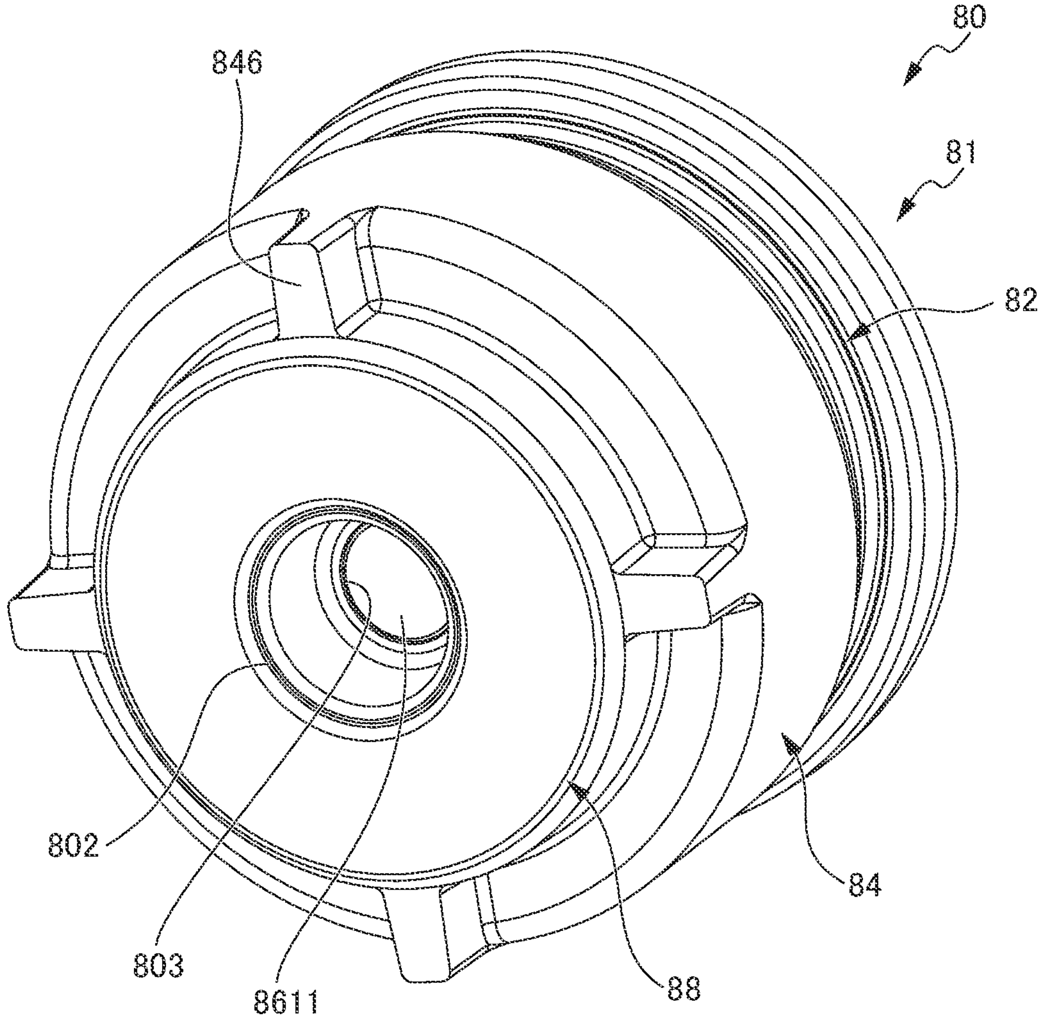
FIG. 6 is a lower perspective view illustrating the air supply filter unit 80 of the substrate storing container 1 according to the first embodiment of the present invention.
Figure 7:
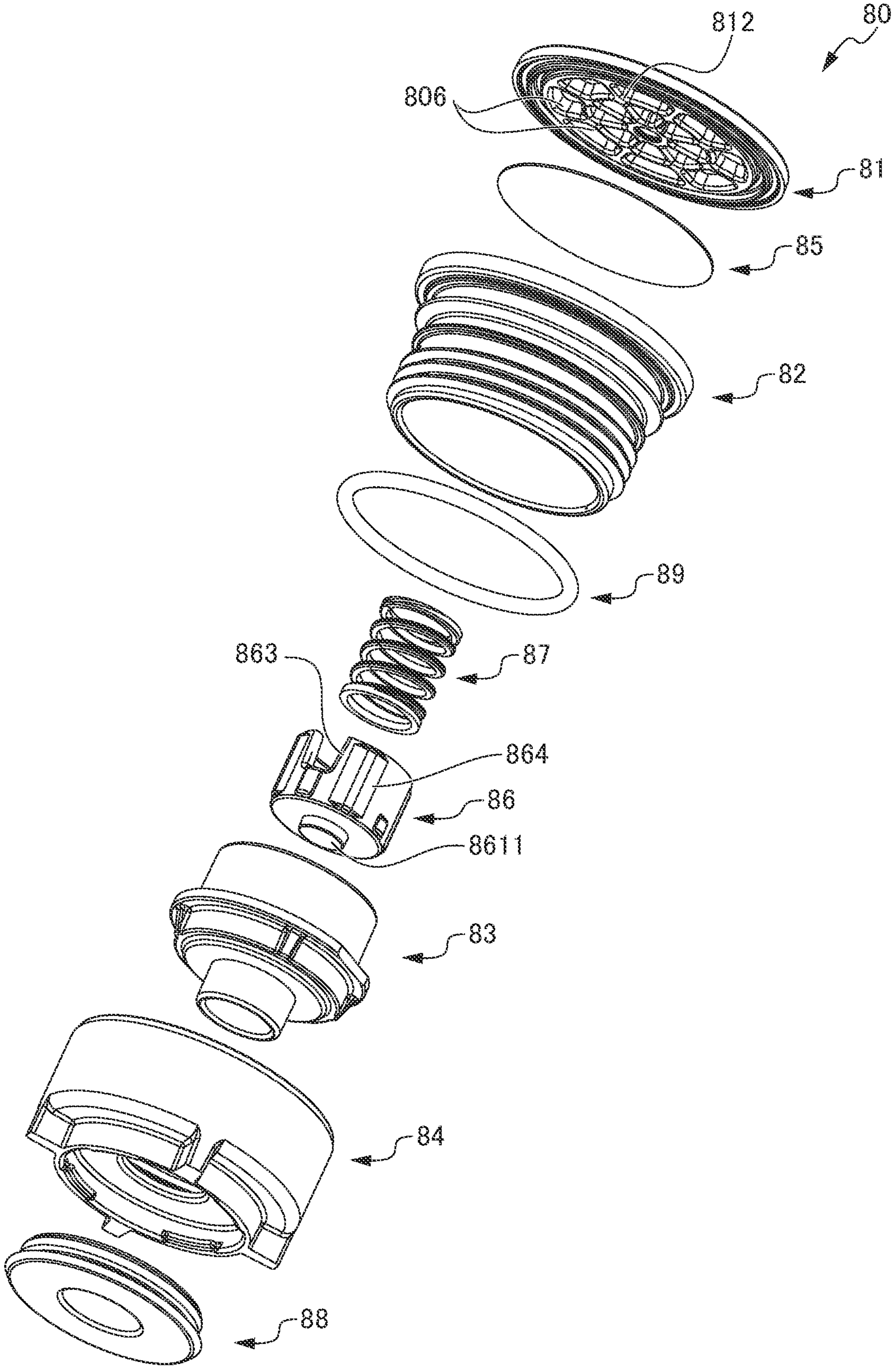
FIG. 7 is an exploded perspective view illustrating the air supply filter unit 80 of the substrate storing container 1 according to the first embodiment of the present invention.
Figure 8:
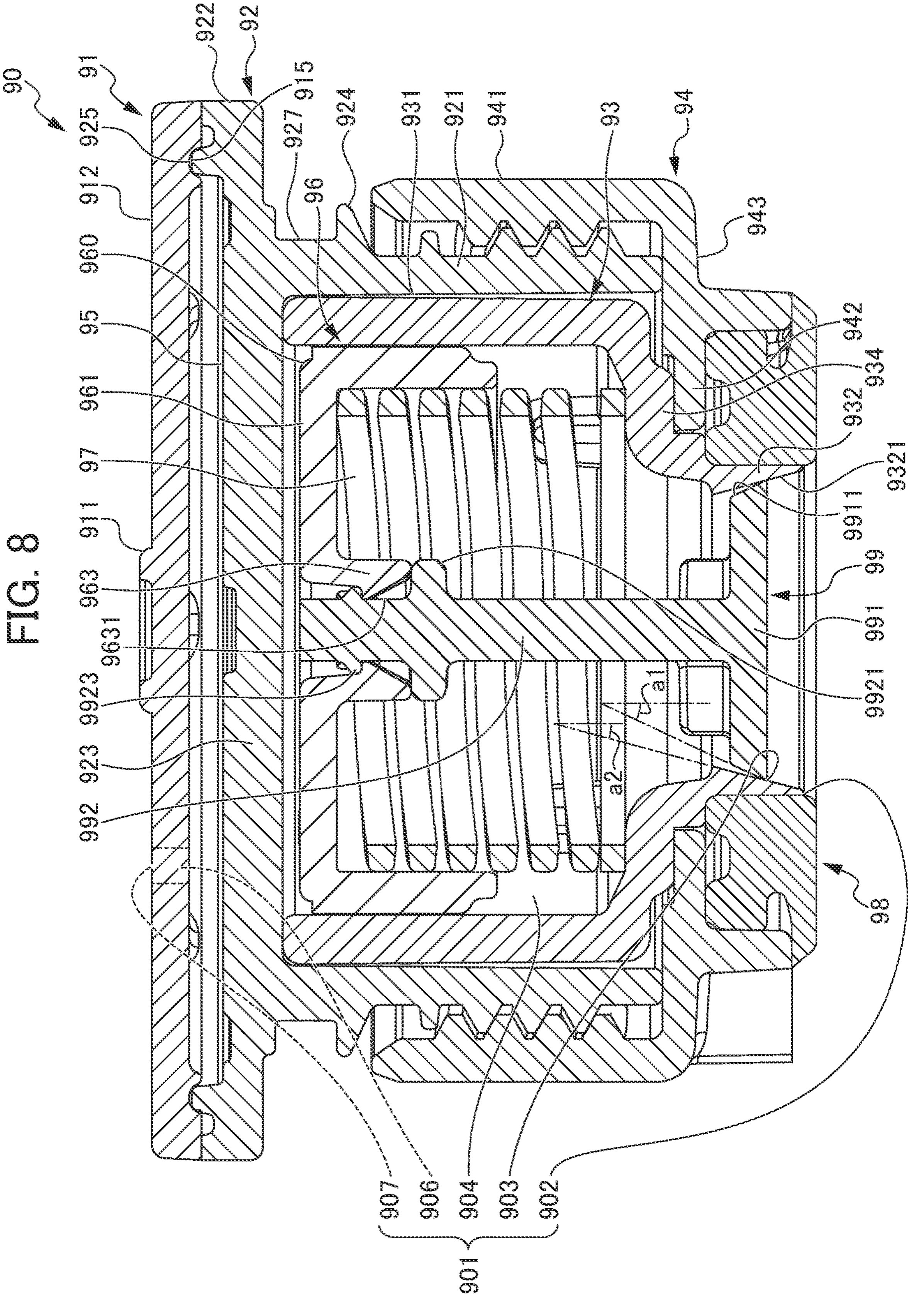
FIG. 8 is a side sectional view illustrating an exhaust filter unit 90 of the substrate storing container 1 according to the first embodiment of the present invention.
Figure 9:
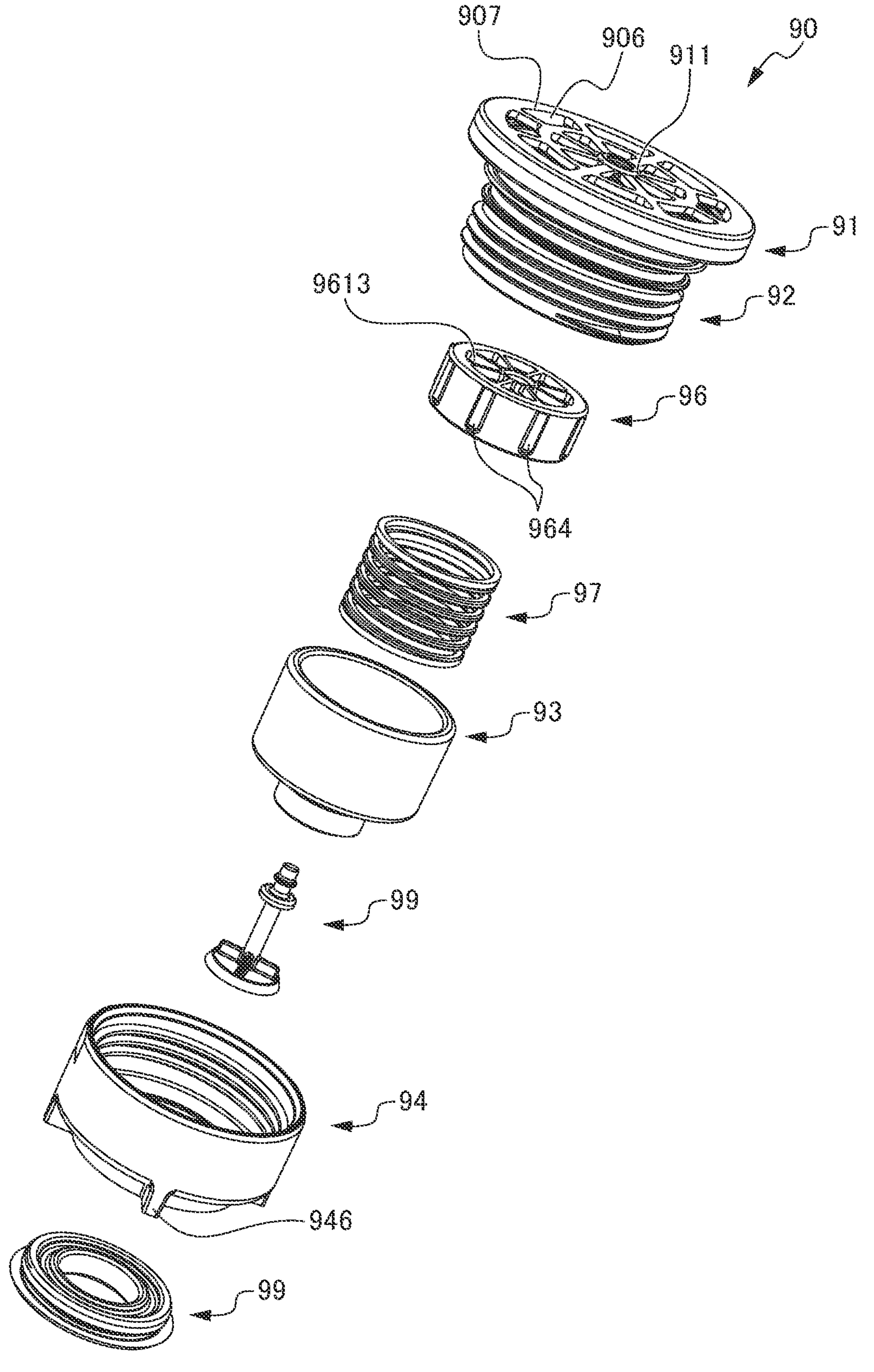
FIG. 9 is an exploded perspective view illustrating the exhaust filter unit 90 of the substrate storing container 1 according to the first embodiment of the present invention.

Hereinafter, each portion will be described in detail. FIG. 5 is a side sectional view illustrating an air supply filter unit 80 of the substrate storing container 1. FIG. 6 is a lower perspective view illustrating the air supply filter unit 80 of the substrate storing container 1. FIG. 7 is an exploded perspective view illustrating the air supply filter unit 80 of the substrate storing container 1. FIG. 8 is a side sectional view illustrating an exhaust filter unit 90 of the substrate storing container 1. FIG. 9 is an exploded perspective view illustrating the exhaust filter unit 90 of the substrate storing container 1.

As illustrated in FIG. 1, a wall portion 20 of the container main body 2 includes a back wall 22, an upper wall 23, a lower wall 24, a first side wall 25 and a second side wall 26. The back wall 22, the upper wall 23, the lower wall 24, the first side wall 25, and the second side wall 26 are constituted by the material described above and are configured by being integrally molded.

The first side wall 25 and the second side wall 26 face each other. The upper wall 23 and the lower wall 24 face each other. The rear edge of the upper wall 23, the rear edge of the lower wall 24, the rear edge of the first side wall 25, and the rear edge of the second side wall 26 are connected to the back wall 22 without exception. The front edge of the upper wall 23, the front edge of the lower wall 24, the front edge of the first side wall 25, and the front edge of the second side wall 26 constitute the opening circumferential portion 28 forming the substantially rectangular container main body opening portion 21.

The opening circumferential portion 28 is provided in one end portion of the container main body 2. The back wall 22 is positioned in the other end portion of the container main body 2. The profile of the container main body 2 formed by the outer faces of the wall portion 20 is a box shape. The inner face of the wall portion 20, that is, the inner face of the back wall 22, the inner face of the upper wall 23, the inner face of the lower wall 24, the inner face of the first side wall 25, and the inner face of the second side wall 26 form the substrate storage space 27 surrounded by the inner faces. The container main body opening portion 21 formed in the opening circumferential portion 28 communicates with the substrate storage space 27 surrounded by the wall portion 20 and formed in the container main body 2. A maximum of 25 substrates W can be stored in the substrate storage space 27.

As illustrated in FIG. 1, latch engagement concave portions 231A, 231B, 241A, and 241B concaved outward from the substrate storage space 27 are formed at parts of the upper wall 23 and the lower wall 24 near the opening circumferential portion 28. A total of four latch engagement concave portions 231A, 231B, 241A, and 241B are respectively formed near both right and left end portions of the upper wall 23 and the lower wall 24.

As illustrated in FIG. 1, on the outer face of the upper wall 23, a rib 235 is provided by being molded integrally with the upper wall 23. The rib 235 enhances the rigidity of the container main body 2. A top flange 236 is fixed to the middle portion of the upper wall 23. The top flange 236 is a member becoming a part hung and suspended in the substrate storing container 1 when the substrate storing container 1 is suspended in an automatic wafer transfer system (AMHS), a wafer substrate transfer cart (PGV), or the like.

As illustrated in FIG. 3, A bottom plate 244 is fixed to the lower wall 24. The bottom plate 244 has a substantially rectangular plate shape disposed to face substantially the entire face of the lower face constituting the outer face of the lower wall 24, and is fixed to the lower wall 24.

As illustrated in FIG. 3, at the four corners of the lower wall 24, air supply holes 242 and exhaust holes 243, which are two types of through-holes, are formed. In the present embodiment, the two through-holes in the front of the lower wall 24 are the exhaust holes 243 for discharging the gas in the container main body 2 and the two through-holes in the back of the lower wall 24 are the air supply holes 242 for supplying gas into the container main body 2.

An air supply filter unit 80 as an additional component is disposed in the through-hole as the air supply hole 242. An exhaust filter unit 90 is disposed in the through-hole as the exhaust hole 243. That is, the flow paths of gas inside the air supply filter unit 80 and the exhaust filter unit 90 constitute a part of ventilation paths capable of allowing communication between the substrate storage space 27 and the space outside the container main body 2. The air supply filter unit 80 and the exhaust filter unit 90 are disposed in the wall portion 20. In the air supply filter unit 80 and the exhaust filter unit 90, gas can pass between the space outside the container main body 2 and the substrate storage space 27. The air supply filter unit 80 is in communication with the inner space of a gas ejection nozzle portion 8. The purge gas supplied to the air supply filter unit 80 through the inner space of the gas ejection nozzle portion 8 is configured to be supplied to the substrate storage space 27.

As illustrated in FIGS. 5 to 7, the air supply filter unit 80 includes an inner opening forming portion 81, a first housing portion 82, a nozzle portion 83 and a second housing portion 84 that serve as a filter unit housing, and a filter 85, a valve body 86, a spring 87 serving as an urging member, and a close contact pad 88. The inner opening forming portion 81, the first housing portion 82, the nozzle portion 83 and the second housing portion 84 are configured as separated elements respectively made up of independent components. Consequently, the inner opening forming portion 81, the first housing portion 82 and the second housing portion 84 are configured as elements separated from the nozzle portion 83. The filter unit housing, which includes the inner opening forming portion 81, the first housing portion 82, the nozzle portion 83 and the second housing portion 84, forms a ventilation path 801 that includes a valve body accommodation room 804 for accommodating the valve body 86, and allows communication between the substrate storage space 27 and the space outside of the container main body 2. In the air supply filter unit 80, gas can pass from the space outside of the container main body 2 into the substrate storage space 27 through the filter 85.

As illustrated in FIG. 7, the inner opening forming portion 81 has a disc shape. As illustrated in FIG. 5, the middle part of the inner opening forming portion 81 has a circular projection portion 811 projecting in the upper direction D21. The circumferential part of the inner opening forming portion 81 includes a flat plate-like annular circumferential portion 812. As illustrated in FIG. 7, many through-holes 806 are formed in the circular projection portion 811 radially from the center of the circular projection portion 811. The many through-holes 806 constitute the ventilation path 801. The openings at the upper end of the many through-holes 806 form substrate storage space side openings 807 that open toward the substrate storage space 27 and communicate with the substrate storage space 27. Thus, the ventilation path 801 has the substrate storage space side openings 807.

As illustrated in FIG. 5, the first housing portion 82 includes a tubular portion 821, an end flange portion 822 and an end plate-like portion 823. The tubular portion 821 has a disc shape. The end plate-like portion 823 having a disc shape is integrally molded and connected to the upper end portion of the tubular portion 821. A male thread portion is threaded on the side face (outer peripheral face) of the tubular portion 821. In the part of the side face of the tubular portion 821 that is above the male thread portion, a small flange portion 824 is provided by being integrally molded with the tubular portion 821. The end flange portion 822 is provided by being integrally molded with the tubular portion 821 in the upper end portion of the tubular portion 821 above a part of the tubular portion 821 where the small flange portion 824 exists. The end flange portion 822 has a convex portion 825 extending in the upper direction D21. The end flange portion 822 is fixed to the annular circumferential portion 812 by welding the convex portion 825 and the part of the annular circumferential portion 812 where the concave portion 815 is formed in the inner opening forming portion 81. Thus, the first housing portion 82 is connected to the inner opening forming portion 81 with a positional relationship coaxial with the inner opening forming portion 81.

As illustrated in FIG. 5, the nozzle portion 83 has a tubular portion 831 and an external projection portion 832. The tubular portion 831 has a cylindrical shape. The inner peripheral face of the tubular portion 831 constitutes an inner peripheral sliding face on which the outer peripheral face of the valve body main body portion 860 of a valve body 86 (described later) is slid. The lower portion of the outer peripheral face of the tubular portion 831 has a large outer diameter portion 833 having a large outer diameter. The lower end portion of the large outer diameter portion 833 is connected, by integrally molding, to a large diameter portion bottom portion 834 provided so as to reduce the inner diameter of the lower end portion of the large outer diameter portion 833. The large diameter portion bottom portion 834 and the external projection portion 832 are connected to each other by integrally molding. The outer diameter of the upper portion of the large outer diameter portion 833 is slightly smaller than the inner diameter of the tubular portion 821 of the first housing portion 82. Although not illustrated in FIG. 5, a gap is formed between the outer peripheral face of the upper portion of the large outer diameter portion 833 and the inner peripheral face of the tubular portion 821. Accordingly, the nozzle portion 83 can slightly move with respect to the tubular portion 821 in the directions (in the left/right direction and the direction connecting the back side and the near side with respect to the plane of paper in FIG. 5) orthogonal to the axes of the nozzle portion 83 and the tubular portion 821 in a state where the axes of the nozzle portion 83 and the tubular portion 821 keep a parallel positional relationship with the tubular portion 821. A cylindrical through-hole is formed in the middle of the large diameter portion bottom portion 834. The through-hole constitutes an external space side accommodation room opening 803 as an outward opening portion. The upper face of the large diameter portion bottom portion 834 and a part of the nozzle portion 83 that forms the external space side accommodation room opening 803 constitute a valve seat against which a sealing wall 861 as a sealing portion and a convex portion 8611 abut.

The external projection portion 832 has a cylindrical shape with a short axial length. The outer diameter and the inner diameter of the external projection portion 832 are smaller than the outer diameter and the inner diameter of the large outer diameter portion 833, respectively. The opening at the lower end portion of the external projection portion 832 constitutes an external space side opening 802. The external space side opening 802 constitutes a ventilation path 801. Thus, the ventilation path 801 includes the external space side opening 802.

As illustrated in FIG. 5, the second housing portion 84 includes a tubular portion 841, an end inward projection portion 842 and an end axial direction projection portion 843. The tubular portion 841 has a cylindrical shape. The inner diameter of the tubular portion 841 is larger than the outer diameter of the tubular portion 821 of the first housing portion 82. Accordingly, the first housing portion 82 is disposed in the space formed by the inner peripheral face of the tubular portion 841 of the second housing portion 84 with a coaxial positional relationship with the tubular portion 841 of the second housing portion 84.

A female thread portion is threaded on the inner peripheral face of the tubular portion 841. The male thread portion of the tubular portion 821 of the first housing portion 82 is screwed into the female thread portion. Accordingly, the second housing portion 84 is fixed to the first housing portion 82. The end inward projection portion 842 is provided by being integrally molded with the lower end portion of the tubular portion 841. The end inward projection portion 842 projects inward in the radial direction of the tubular portion 841 from the lower end portion of the tubular portion 841, and has an annular plate shape. The end axial direction projection portion 843 projects in the lower direction D22 from the lower face of the end inward projection portion 842, and has an annular shape. As illustrated in FIG. 6 and the like, rib portions 846 projecting outside of the tubular portion 841 from the end axial direction projection portion 843 are provided. The four rib portions 846 are formed at regular intervals in the circumferential direction of the tubular portion 841.

A part of the nozzle portion 83 that is around the external space side opening 802, that is, the lower end portion of the external projection portion 832 projects in the lower direction D22 that is the direction in which the ventilation path 801 is opened at the external space side opening 802. The lower end portion of the external projection portion 832 and the end axial direction projection portion 843 constitute a U-shaped part opening downward. The close contact pad 88 is fitted with the U-shaped part.

The close contact pad 88 is formed to have an annular shape having a coaxial positional relationship with the external space side opening 802. The surface of the distal end portion of the close contact pad 88 in the outward direction (the lowermost face of the close contact pad 88 in FIG. 7) is disposed at a lower position than the distal end portion of the second housing portion 84 in the outward direction of the storage space 27 (the lowermost end of the second housing portion 84 in FIG. 5). The distal end portion of the close contact pad 88 in the outward direction of the storage space 27 (the lowermost face of the close contact pad 88 in FIG. 5) constitutes a sealing surface that is in close contact with a purge port (gas injection port) described later. The close contact pad 88 prevents gas from leaking between the purge port, not illustrated, and the sealing surface.

Polycarbonate, which has a small amount of outgas generation, is used for the nozzle portion 83. Besides polycarbonates, resins, such as cycloolefin polymers, polyetherimide and polyether ether ketone, can be used. For example, resins, such as polybutylene terephthalate and polyethylene, elastomers, such as polyethylene elastomer and polyolefin elastomer, and rubber materials, such as silicone rubber and fluororubber can be used for the close contact pad 88. The lower end face of the close contact pad 88 is subjected to emboss processing and roughened.

The first housing portion 82 is fixed to the lower wall 24 with intervention of an O-ring 89 attached into a groove formed on the side face of the first housing portion 82. For fixation of the first housing portion 82 to the lower wall 24, the O-ring 89 is used between the first housing portion 82 and the lower wall 24, and the lower wall 24 and a nozzle portion 93 are sealed.

In the air supply filter unit 80, the inner opening forming portion 81, the first housing portion 82, the nozzle portion 83 and the second housing portion 84, which are included in the filter unit housing, form the ventilation path 801. More specifically, the ventilation path 801 continues from the substrate storage space side opening 807 of the through-holes 806 of the inner opening forming portion 81 to the valve body accommodation room 804 and subsequently to the external space side opening 802 of the nozzle portion 83.

As illustrated in FIGS. 5 and 7, the valve body 86 is made of an elastically deformable material. Specifically, the valve body 86 may be made of any of various elastically deformable thermoplastic elastomers, such as elastically deformable polyester-based and polyolefin-based elastomers, fluororubber, silicone rubber and the like. In the present embodiment, for example, polypropylene is used as a desirable material. The valve body 86 includes the substantially tubular-shaped valve body main body portion 860, and the convex portion 8611. One end portion of the valve body 86 is blocked with the sealing wall 861 serving as a sealing portion included in the valve body main body portion 860. The outer face of the sealing wall 861 constitutes a sealing face 862. As illustrated in FIG. 5 and the like, the sealing wall 861 is provided with the convex portion 8611 so as to project from the sealing wall 861. The convex portion 8611 is provided by being integrally molded with the sealing wall 861, and has a cylindrical shape having a shape and dimensions to be fitted with the external space side accommodation room opening 803. As illustrated in FIG. 5, the external space side accommodation room opening 803 can be blocked with the convex portion 8611 by being inserted into and being fitted with the external space side accommodation room opening 803, and the external space side accommodation room opening 803 can be opened by removing the convex portion 8611 from the external space side accommodation room opening 803. The height h1 in the projecting direction of the convex portion 8611 is identical to the length h2 in the penetrating direction of the external space side accommodation room opening 803 as the outward opening portion. As illustrated in FIG. 5, the external space side opening 802 is configured to be wider than the external space side accommodation room opening 803. Accordingly, the opening area of the external space side opening 802 is larger than the opening area of the external space side accommodation room opening 803.

As illustrated in FIG. 7, a notch 863 is formed at a part of the valve body 86 from the middle position of the valve body 86 to the other end portion in the axial direction. The two notches 863 are formed at regular intervals in the circumferential direction of the valve body 86. The side face of the valve body 86 is provided with side face convex portions 864 as rib-shaped portions projecting outside of the valve body 86 in half circular shape from the side face of the valve body 86. The side face convex portions 864 extend from one end of the valve body 86 to the other end on the side face of the valve body 86. The side face convex portions 864 are positioned between the adjacent notches 863 on the side face of the valve body 86.

The total length of the valve body 86 in the axial direction of the valve body 86 is shorter than the distance from the upper end of the tubular portion 831 of the nozzle portion 83 to the upper end of the large outer diameter portion 833 of the nozzle portion 83 in the upper/lower direction D2. The projection ends of the side face convex portions 864 are slidable with the inner peripheral face of the tubular portion 831 of the nozzle portion 83 in the axial direction of the tubular portion 831 of the nozzle portion 83. The sliding makes the valve body 86 slidable between a position (blocking position) at which the sealing face 862 abuts against the large diameter portion bottom portion 834 and blocks the external space side accommodation room opening 803 and a position (uppermost position) at which the upper end portion of the valve body 86 abuts against the end plate-like portion 823 of the first housing portion 82. Thus, the valve body 86 is movable between a communication position at which the substrate storage space 27 communicates with the space outside of the container main body 2 in the valve body accommodation room 804, and a communication blocking position at which communication between the substrate storage space 27 and the space outside of the container main body 2 in the valve body accommodation room 804 is blocked.

Since the side face convex portions 864 is formed, the space for constituting the ventilation path is secured between the side face of the valve body 86 and the inner peripheral face of the tubular portion 831 of the nozzle portion 83. Since the notches 863 are formed in the valve body 86, the space for constituting the ventilation path 801 is secured even when the upper end portion of the valve body 86 abuts against the end plate-like portion 823 of the first housing portion 82.

The filter 85 has a disc shape. The circumferential portion of the filter 85 is fixed to the end flange portion 822 of the first housing portion 82 and the annular circumferential portion 812 of the inner opening forming portion 81 with a positional relationship so as to be sandwiched between the end flange portion 822 and the annular circumferential portion 812. As a result, the filter 85 is disposed in the ventilation path 801. Consequently, the valve body accommodation room 804 is disposed at a part of the ventilation path 801 closer to the space outside of the container main body 2 than the filter 85. The filter 85 prevents particles or the like from passing through the through-holes 806 of the inner opening forming portion 81.

The spring 87 as the urging member is made up of a compression spring. The lower end portion of the spring 87 abuts against the inner face of the sealing wall 861 of the valve body 86. The upper end portion of the spring 87 abuts against the end plate-like portion 823 of the first housing portion 82.

Consequently, when the valve body 86 is at the position of blocking the ventilation path 801, the spring 87 urges the valve body 86 so as to insert the convex portion 8611 of the valve body 86 into the external space side accommodation room opening 803 and cause the sealing face 862 of the valve body 86 to block the external space side accommodation room opening 803, in order to prevent gas from flowing from the external space side accommodation room opening 803 into the valve body accommodation room 804.

As illustrated in FIGS. 8 and 9, the exhaust filter unit 90 includes an inner opening forming portion 91, a first housing portion 92, a nozzle portion 93 and a second housing portion 94 that serve as a filter unit housing, and a filter 95, a spring seat 96, a spring 97 serving as an urging member, a close contact pad 98 and a valve body 99. The inner opening forming portion 91, the first housing portion 92, the nozzle portion 93 and the second housing portion 94 are configured as separated elements respectively made up of independent components. Consequently, the inner opening forming portion 91, the first housing portion 92 and the second housing portion 94 are configured as elements separated from the nozzle portion 93. The filter unit housing, which includes the inner opening forming portion 91, the first housing portion 92, the nozzle portion 93 and the second housing portion 94, forms a ventilation path 901 that includes a valve body accommodation room 904 for accommodating the spring seat 96, and allows communication between the substrate storage space 27 and the space outside of the container main body 2. In the exhaust filter unit 90, gas can pass from the substrate storage space 27 to the space outside of the container main body 2 through the filter 95.

As illustrated in FIG. 8, the inner opening forming portion 91 has a disc shape. The middle part of the inner opening forming portion 91 has a circular projection portion 911 projecting in the upper direction D21. The circumferential part of the inner opening forming portion 91 includes a flat plate-like annular circumferential portion 912. As illustrated in FIG. 9, many through-holes 906 are formed in the circular projection portion 911 radially from the center of the circular projection portion 911. The many through-holes 906 constitute the ventilation path 901. The openings at the upper end of the many through-holes 906 form substrate storage space side openings 907 that open toward the substrate storage space 27 and communicate with the substrate storage space 27. Thus, the ventilation path 901 includes substrate storage space side openings 907.

As illustrated in FIG. 8, the first housing portion 92 includes a tubular portion 921, an end flange portion 922 and an end plate-like portion 923. The tubular portion 921 has a disc shape. The end plate-like portion 923 having a disc shape is integrally molded and connected to the upper end portion of the tubular portion 921. A male thread portion is threaded on the side face (outer peripheral face) of the tubular portion 921. In the part of the side face of the tubular portion 921 that is above the male thread portion, a small flange portion 924 is provided by being integrally molded with the tubular portion 921. The end flange portion 922 is provided by being integrally molded with the tubular portion 921 in the upper end portion of the tubular portion 921 above the part of the tubular portion 921 where the small flange portion 924 exists. The end flange portion 922 has a convex portion 925 extending in the upper direction D21. The end flange portion 922 is fixed to the annular circumferential portion 912 by welding the convex portion 925 and the part of the annular circumferential portion 912 where the concave portion 915 is formed in the inner opening forming portion 91. Thus, the first housing portion 92 is connected to the inner opening forming portion 91 with a positional relationship coaxial with the inner opening forming portion 91.

As illustrated in FIG. 8, the nozzle portion 93 has a tubular portion 931 and an external projection portion 932. The tubular portion 941 has a cylindrical shape. The inner peripheral face of the tubular portion 931 constitutes an inner peripheral sliding face on which the outer peripheral face of a spring seat main body portion 960 of the spring seat 96 (described later) is slid. The lower portion of the tubular portion 931 is connected to the bottom portion 934 by integrally molding. The bottom portion 934 and the external projection portion 932 are connected to each other by integrally molding. The outer diameter of the tubular portion 931 is slightly smaller than the inner diameter of the tubular portion 921 of the first housing portion 92. As illustrated in FIG. 8, a gap is formed between the outer peripheral face of the upper portion of the tubular portion 931 and the inner peripheral face of the tubular portion 921. Accordingly, the nozzle portion 93 can slightly move with respect to the tubular portion 921 in the directions (in the left/right direction and the direction connecting the back side and the near side with respect to the plane of paper in FIG. 8) orthogonal to the axes of the nozzle portion 93 and the tubular portion 921. A cylindrical through-hole is formed in the middle of the bottom portion 934. The through-hole constitutes an external space side accommodation room opening 903.

The external projection portion 932 has a cylindrical shape with a short axial length. The outer diameter of the external projection portion 932 is smaller than that of the tubular portion 931, and the inner diameter of the external projection portion 932 is smaller than that of the tubular portion 931. As illustrated in FIG. 8, the inner peripheral face of the external projection portion 932 of the nozzle portion 93 forming the external space side accommodation room opening 903 has a flared shape with a diameter increasing toward the space outside of the container main body 2. This part constitutes a valve seat against which the valve body main body 991 serving as the sealing portion abuts.

The opening at the lower end portion of the external projection portion 932 constitutes an external space side opening 902. The external space side opening 902 constitutes a ventilation path 901. Thus, the ventilation path 901 includes an external space side opening 902.

As illustrated in FIG. 8, the second housing portion 94 includes a tubular portion 941, an end inward projection portion 942 and an end axial direction projection portion 943. The tubular portion 941 has a cylindrical shape. The inner diameter of the tubular portion 941 is larger than the outer diameter of the tubular portion 921 of the first housing portion 92. Accordingly, the first housing portion 92 is disposed in the space formed by the inner peripheral face of the tubular portion 941 of the second housing portion 94 with a coaxial positional relationship with the tubular portion 941 of the second housing portion 94.

A female thread portion is threaded on the inner peripheral face of the tubular portion 941. The male thread portion of the tubular portion 921 of the first housing portion 92 is threaded with the female thread portion.

Accordingly, the second housing portion 94 is fixed to the first housing portion 92. The end inward projection portion 942 is provided by being integrally molded with the lower end portion of the tubular portion 941. The end inward projection portion 942 projects inward in the radial direction of the tubular portion 941 from the lower end portion of the tubular portion 941, and has an annular plate shape. The end axial direction projection portion 943 projects in the lower direction D22 from the lower face of the end inward projection portion 942 and has an annular shape. As illustrated in FIG. 9 and the like, rib portions 946 projecting outside of the tubular portion 941 from the end axial direction projection portion 943 are provided. The four rib portions 946 are formed at regular intervals in the circumferential direction of the tubular portion 941.

A part of the nozzle portion 93 that is around the external space side opening 902, that is, the lower end portion of the external projection portion 932 projects in the lower direction D22 that is the direction in which the ventilation path 901 is opened at the external space side opening 902. The lower end portion of the external projection portion 932 and the end axial direction projection portion 943 constitute a U-shaped part opening downward. The close contact pad 98 is fitted with the U-shaped part.

The close contact pad 98 is formed to have an annular shape having a coaxial positional relationship with the external space side opening 902. The surface of the distal end portion of the close contact pad 98 in the outward direction (the lowermost face of the close contact pad 98 in FIG. 8) is disposed at a lower position than the distal end portion of the second housing portion 94 in the outward direction of the storage space 27 (the lowermost end of the second housing portion 94 in FIG. 8) and the distal end portion of the external projection portion 932 of the nozzle portion 93 in the outward direction of the storage space 27 (the lowermost end of the external projection portion 932 in FIG. 8). The distal end portion of the close contact pad 98 in the outward direction of the storage space 27 (the lowermost face of the close contact pad 98 in FIG. 8) constitutes a sealing surface that is to be in close contact with a purge port (gas injection port) described later. The close contact pad 98 prevents gas from leaking between the purge port, not illustrated, and the sealing surface.

Polycarbonate is used for the nozzle portion 93 that has a small amount of outgas generation. Besides polycarbonates, resins, such as cycloolefin polymers, polyetherimide and polyether ether ketone, can be used. For example, resins, such as polybutylene terephthalate and polyethylene, elastomers, such as polyethylene elastomer and polyolefin elastomer, and rubber materials, such as silicone rubber and fluororubber can be used for the close contact pad 98. The lower end face of the close contact pad 98 is subjected to emboss processing and roughened.

The first housing portion 92 is fixed to the lower wall 24 with intervention of an O-ring (not illustrated) attached into a groove 927 formed on the side face of the first housing portion 92. For fixation of the first housing portion 92 to the lower wall 24, the O-ring (not illustrated) is used between the first housing portion 92 and the lower wall 24 and the lower wall 24 and a nozzle portion 93 are sealed.

In the exhaust filter unit 90, the inner opening forming portion 91, the first housing portion 92, the nozzle portion 93 and the second housing portion 94, which are included in the filter unit housing, form the ventilation path 901. More specifically, the ventilation path 901 continues from the substrate storage space side opening 907 of the through-holes 906 of the inner opening forming portion 91 to the valve body accommodation room 904 and subsequently to the external space side opening 902 of the nozzle portion 93.

As illustrated in FIGS. 8 and 9, the spring seat 96 is supported by the nozzle portion 93 and constitutes an urged member that guides movement of the valve body 99. The spring seat 96 includes a substantially cylindrical-shaped spring seat main body portion 960 and a middle tubular convex portion 963. One end portion of the spring seat 96 is blocked with an end portion wall 961 included in the spring seat main body portion 960. The spring seat main body portion 960 constitutes an urged member main body portion.

As illustrated in FIG. 8 and the like, the middle part of the end portion wall 961 is provided with a middle tubular convex portion 963 that projects from the end portion wall 961 in the lower direction. As illustrated in FIG. 9, a plurality of through-holes 9613 as gas flow paths allowing gas to pass therethrough are formed at the end portion wall 961 around the middle tubular convex portion 963. The middle tubular convex portion 963 is provided to be integrally molded with the end portion wall 961. At the middle part of the middle tubular convex portion 963, a through-hole that penetrates in the axial direction of the spring seat 96 is formed. The projection end portion of the middle tubular convex portion 963 slightly projects inward in the radial direction of the spring seat 96. The middle tubular convex portion 963 constitutes a valve body fixation portion.

The valve body 99 includes a valve body main body 991 and a valve body shaft portion 992. The valve body main body 991 has a flared shape that has a diameter increasing toward the space outside of the container main body 2 and includes a flared surface 9911. In the sectional view illustrated in FIG. 8, this body has a trapezoidal shape. The end edge of the bottom portion of the trapezoidal shape has dimensions to be fitted into the external space side accommodation room opening 903. As illustrated in FIG. 8, the external space side accommodation room opening 903 can be blocked with the valve body main body 991 by fitting the valve body main body 991 into the external space side accommodation room opening 903, and the external space side accommodation room opening 903 can be opened by removing the valve body main body 991 from the external space side accommodation room opening 903.

The valve body main body 991 constitutes a through-hole block portion as a sealing portion of the valve body 99 for blocking the external space side accommodation room opening 903. As illustrated in FIG. 8, the flare rate of the outer peripheral face of the valve body main body 991 per unit length in the axial direction of the valve body main body 991 is higher than the flare rate of the flared surface 9321 of the inner peripheral face of the part of the external projection portion 932 that forms the external space side opening 902 and the external space side accommodation room opening 903 per unit length in the axial direction of the external space side opening 902 and the external space side accommodation room opening 903. That is, as illustrated in FIG. 8, the inclination angle a1 of the flare of the outer peripheral face of the valve body main body 991 from the axial direction of the valve body main body 991 is larger than the inclination angle a2 of the flare of the inner peripheral face of the part of the external projection portion 932 from the axial direction of the part of the external projection portion 932 that forms the external space side opening 902 and the external space side accommodation room opening 903.

The lower end portion of the valve body shaft portion 992 is integrally molded with and connected to the valve body main body 991. The upper portion of the valve body shaft portion 992 includes: a downward projection portion 9921 that projects outward in the radial direction of the valve body shaft portion 992; and an upward projection portion 9923 that projects outward in the radial direction of the valve body shaft portion 992 at a position that is on the upper side of the downward projection portion 9921 and is apart from this downward projection portion 9921. The downward projection portion 9921 is configured to have a large amount of projection than the upward projection portion 9923. The part of the valve body shaft portion 992 on the upper end side of the downward projection portion 9921 is inserted into the through-hole of the middle tubular convex portion 963, and the projecting end portion of the middle tubular convex portion 963 is fitted between the downward projection portion 9921 and the upward projection portion 9923, thereby allowing the upper end portion of the valve body shaft portion 992 to be fixed and connected to the middle tubular convex portion 963 of the spring seat 96 in an attachable and detachable manner. Accordingly, the spring seat 96 and the valve body 99 can be integrally moved in the axial direction thereof.

The valve body 99 is made of an elastically deformable material. Specifically, the valve body 99 may be made of any of various elastically deformable thermoplastic elastomers, such as elastically deformable polyester-based and polyolefin-based elastomers, fluororubber, silicone rubber and the like. In the present embodiment, for example, polypropylene is used as a desirable material.

As illustrated in FIG. 9, the side face of the spring seat 96 is provided with a side face convex portions 964 as rib-shaped portions projecting outside of the spring seat 96 in half circular shape from the side face of the spring seat 96. The side face convex portions 964 extend from one end of the spring seat 96 to the other end on the side face of the spring seat 96. The plurality of side face convex portions 964 are provided on the side face of the spring seat 96 in the circumferential direction of the spring seat 96.

The length of the substantially cylindrical-shaped spring seat main body portion 960 in the axial direction of the spring seat 96 in the axial direction of the spring seat 96 is smaller than the length of the tubular portion 931 of the nozzle portion 93 in the upper/lower direction D2. Consequently, the spring seat 96 is slidable with the inner peripheral face of the tubular portion 931 of the nozzle portion 93 in the axial direction of the tubular portion 931. The sliding allows the spring seat 96 to move between a position (blocked position) at which the valve body main body 991 abuts against the inner peripheral face of the external projection portion 932 of the nozzle portion 93 and blocks the external space side accommodation room opening 903, and a position (open position) at which the valve body main body 991 is moved downward lower than the position illustrated in FIG. 8, is apart from the inner peripheral face of the external projection portion 932 of the nozzle portion 93 and opens the external space side accommodation room opening 903.

Since the side face convex portions 964 is formed, the space for constituting the ventilation path is secured between the side face of the spring seat 96 and the inner peripheral face of the tubular portion 931 of the nozzle portion 93.

The filter 95 has a disc shape. The circumferential portion of the filter 95 is fixed to the end flange portion 922 of the first housing portion 92 and the annular circumferential portion 912 of the inner opening forming portion 91 with a positional relationship so as to be sandwiched between the end flange portion 922 and the annular circumferential portion 912. As a result, the filter 95 is disposed in the ventilation path 901. Consequently, the valve body accommodation room 904 is disposed at a part of the ventilation path 901 closer to the space outside of the container main body 2 than the filter 95. The filter 95 prevents particles or the like from passing through the through-holes 906 of the inner opening forming portion 91.

It is configured so that the effective area of the filter 95 of the exhaust filter unit 90 is larger than the effective area of the filter 85 of the air supply filter unit 80. Specifically, it is preferable that the effective area of the filter 95 of the exhaust filter unit 90 be 1.5 times or larger than the effective area of the filter 85 of the air supply filter unit 80. In the present embodiment, twice or more. The configuration of 1.5 times or larger is because 1.5 times or smaller cannot allow effective gas purge and requires a long time for gas purge. The configuration of twice or more is made because of capability of secure and efficient gas purge.

The spring 97 as the urging member is made up of a compression spring. The upper end portion of the spring 97 abuts against the inner face (lower face) of the end portion wall 961 of the spring seat 96. The lower end portion of the spring 97 abuts against the bottom portion 934 of the nozzle portion 93.

Consequently, when the valve body 99 is at the position of blocking the ventilation path 901, the spring 97 urges the end portion wall 961 of the spring seat 96 in the direction toward the filter 95 (the upper direction in FIG. 8) so as to prevent gas from flowing to the external space from the external space side accommodation room opening 903. That is, the spring 97 urges the valve body 99 so as to move to the blocked position. As illustrated in FIG. 8, the spring 97 is configured to have a diameter larger than the diameter of the external space side opening 902 that is a part of the external space side accommodation room opening 903 having the maximum diameter.

As illustrated in FIG. 2 and so on, the substrate support plate-like portions 5 are provided in the first side wall 25 and the second side wall 26 so as to make a pair in the left/right direction D3 in the substrate storage space 27 in the container main body 2. Specifically, as illustrated in FIG. 4 and so on, the substrate support plate-like portion 5 has plate portions 51.

The plate portion 51 has a plate-like substantially arc shape. Twenty-five plate portions 51 are provided in each of the first side wall 25 and the second side wall 26 in the upper/lower direction D2, i.e., a total of 50 plate portions are provided. The adjacent plate portions 51 are separated from each other at an interval of 10 mm to 12 mm in the upper/lower direction D2 and arranged in parallel.

The 25 plate portions 51 provided in the first side wall 25 and the 25 plate portions 51 provided in the second side wall 26 face each other in the left/right direction D3. Convex portions 511 and 512 are provided on the upper face of each plate portion 51. The substrate W supported by the plate portion 51 is only in contact with projection ends of the convex portions 511 and 512 and is not in contact with the plate portion 51 with an area.

The substrate support plate-like portions 5 having such a configuration are capable of supporting the edge portions of the plurality of substrate W in a state where the adjacent substrates W of the plurality of the substrates W are separated from each other at a predetermined interval and arranged in parallel.

As illustrated in FIG. 4, the back side substrate support portion 6 has back side end edge support portions 60. The back side end edge support portions 60 are integrally molded with the container main body 2 in the rear end portions of the plate portions 51 of the substrate support plate-like portions 5.

The number of the back side end edge support portions 60 corresponds to the number of the substrates W that can be stored in the substrate storage space 27, specifically, 25 back side end edge support portions 60 are provided. The back side end edge support portions 60 disposed in the first side wall 25 and the second side wall 26 have a positional relationship that makes a pair with the front retainer described later in the forward/backward direction D1. The substrates W are stored in the substrate storage space 27 and then the lid body 3 is closed, thereby allowing the back side end edge support portions 60 to clump and support the end edges of the edge portions of the substrates W.

As illustrated in FIG. 1, the lid body 3 has a substantially rectangular shape that substantially matches the shape of the opening circumferential portion 28 of the container main body 2. The lid body 3 can be attached to and detached from the opening circumferential portion 28 of the container main body 2. The container main body opening portion 21 can be blocked by the lid body 3 by the lid body 3 being mounted in the opening circumferential portion 28, with a positional relationship in which the lid body 3 is surrounded by the opening circumferential portion 28.

An annular sealing member 4 is attached to the inner face of the lid body 3 (rear face of the lid body 3 illustrated in FIG. 1) so as to go around the outer circumferential edge portion of the lid body 3. The face faces a face (sealing face 281) of the step part formed at a position directly behind (backward direction D12) the opening circumferential portion 28 at a time when the lid body 3 blocks the container main body opening portion 21. The sealing member 4 is disposed so as to go around the lid body 3. The sealing member 4 is made of various types of elastically deformable thermoplastic elastomers such as polyester-based elastomers and polyolefin-based elastomers, fluororubber, silicon rubber, or the like.

When the lid body 3 is mounted in the opening circumferential portion 28, the sealing member 4 is elastically deformed by being sandwiched between the sealing face 281 (see FIG. 1) of the container main body 2 and the inner face of the lid body 3. In other words, with the sealing member 4 interposed between lid body 3 and the container main body 2, the lid body 3 can block the container main body opening portion 21 in a state where the lid body 3 and the opening circumferential portion 28 do not abut against each other and are separated from each other. By the lid body 3 being removed from the opening circumferential portion 28, the substrate W can be taken in and out of the substrate storage space 27 in the container main body 2.

The lid body 3 is provided with a latch mechanism. The latch mechanism is provided near both right and left end portions of the lid body 3. As illustrated in FIG. 1, the latch mechanism is provided with two upper side latch portions 32A and 32A capable of projecting upward from the upper side of the lid body 3 and two lower side latch portions 32B and 32B capable of projecting downward from the lower side of the lid body 3. The two upper side latch portions 32A and 32A are disposed near both right and left ends of the upper side of the lid body 3. The two lower side latch portions 32B and 32B are disposed near both right and left ends of the lower side of the lid body 3.

An operation portion 33 is provided on the outer face of the lid body 3. By operating the operation portion 33 from the front side of the lid body 3, it is possible to cause the upper side latch portions 32A and 32A and the lower side latch portions 32B and 32B to project from the upper and lower sides of the lid body 3 and cause the upper side latch portions 32A and 32A and the lower side latch portions 32B and 32B not to project from the upper and lower sides. The upper side latch portions 32A and 32A are engaged with the latch engagement concave portions 231A and 231B of the container main body 2 by projecting upward from the upper side of the lid body 3 and the lower side latch portions 32B and 32B are engaged with the latch engagement concave portions 241A and 241B of the container main body 2 by projecting downward from the lower side of the lid body 3. As a result, the lid body 3 is fixed to the opening circumferential portion 31 of the container main body 2.

A concave portion (not illustrated) concaved outward (forward direction D11) from the storage space 27 is formed on the inner side (side of backward direction D12 of the lid body 3 in FIG. 1) of the lid body 3. The front retainer (not illustrated) is fixedly provided at parts of the lid body 3 in the concave portion (not illustrated) and outside of the concave portion.

The front retainer (not illustrated) has front retainer substrate receiving portions (not illustrated). The front retainer substrate receiving portions (not illustrated) are disposed two by two so as to make a pair and at a predetermined interval in the left/right direction. The front retainer substrate receiving portions disposed two by two so as to make a pair as described above are provided in a state where 25 pairs are arranged in parallel in the upper/lower direction. The front retainer substrate receiving portions support the end edge of the edge portion of the substrate W by the substrate W being stored in the storage space 27 and the lid body 3 being closed.

According to the substrate storing container 1 according to the present embodiment having the above configuration, the following effects can be obtained. As described above, the filter unit housing of the air supply filter unit 80, which includes the first housing portion 82, the nozzle portion 83 and the second housing portion 84, accommodates the valve body 86 that blocks the external space side accommodation room opening 803 as an outward opening portion by being inserted into the external space side accommodation room opening 803, and opens the external space side accommodation room opening 803 by being removed from the external space side accommodation room opening 803.

According to the configuration described above, when the cleaning apparatus is periodically used to clean up, with washing water, contaminants and particles adhering to the container, the external space side accommodation room opening 803 is blocked by insertion of the convex portion 8611 of the valve body 86 into the external space side accommodation room opening 803. Thus, washing water can be prevented from entering the ventilation path that is at an inner position in the filter unit housing with respect to the external space side accommodation room opening 803. As a result, the time period for drying the ventilation path in the filter unit housing can be significantly reduced.

Even when the valve body 86 is slightly lifted upward in FIG. 5, the state where the convex portion 8611 of the valve body 86 is inserted into the external space side accommodation room opening 803 is maintained, thus maintaining the state where the external space side accommodation room opening 803 is blocked. When the distance between the lower face of the sealing wall 861 and the upper face of the large diameter portion bottom portion 834 of the nozzle portion illustrated in FIG. 5 reaches a predetermined distance, the convex portion 8611 is removed from the external space side accommodation room opening 803, and the state where the ventilation path is opened is established. Accordingly, unlike the conventional valve body, occurrence of chattering noise due to repetition of slight opening and closing immediately thereafter in a short time period can be prevented.

The opening area of the external space side opening 802 opened toward the space outside of the container main body 2 is larger than the opening area of the external space side accommodation room opening 803 into which the valve body 86 is inserted. According to this configuration, the flow of gas flowing from the external space side opening 802 having the larger opening area facilitates transition from the state where the convex portion 8611 of the valve body 86 is inserted into the external space side accommodation room opening 803 to the state where the convex portion 8611 is not inserted, thereby allowing gas purge to be performed quickly.

The nozzle portion 83 included in the inner housing portion has the external space side accommodation room opening 803 as an outward opening portion. This configuration can achieve a configuration of including the valve body 86 having the convex portion 8611 to be fitted into the external space side accommodation room opening 803 of the nozzle portion 83.

The valve body 86 includes the valve body main body portion 860 and the convex portion 8611 that projects from the valve body main body portion 860 and is inserted into the external space side accommodation room opening 803. This configuration can easily achieve the valve body 86 that blocks the external space side accommodation room opening 803 by being inserted into this external space side accommodation room opening 803, and opens the external space side accommodation room opening 803 by being removed from this external space side accommodation room opening 803.

A part of the valve body main body portion 860 around the convex portion 8611 constitutes a sealing portion, the nozzle portion 83 as the inner housing portion includes a tubular portion 831 that includes an inner peripheral sliding face on which the valve body main body portion 860 is slide to support the valve body main body portion 860, and a part of the nozzle portion 83 around the external space side accommodation room opening 803 constitutes a valve seat against which the sealing portion abuts. This configuration can easily constitute the valve seat against which the sealing portion of the valve body 86 abuts that blocks the external space side accommodation room opening 803 as an outward opening portion by being inserted into this external space side accommodation room opening 803, and opens the external space side accommodation room opening 803 by being removed from this external space side accommodation room opening 803.

The valve body main body portion 860 is provided with side face convex portions 864 as the rib-shaped portion that directly abut against and are slid on the inner peripheral sliding face of the tubular portion 831. This configuration can suppress sliding sounds of the side face convex portions 864 against the inner peripheral sliding face of the tubular portion 831 and chattering noise.

The air supply filter unit 80 includes the spring 87 as the urging member that urges the valve body 86 in the direction of insertion into the external space side accommodation room opening 803. This configuration makes the spring constant of the spring 87 an appropriate value, thereby allowing the ventilation path to be more securely blocked with the valve body 86 when the pressure by gas is equal to or lower than a predetermined pressure.

In addition, according to the substrate storing container 1 according to the present embodiment having the above configuration, the following effects can be obtained. The filter unit housing of the exhaust filter unit 90 accommodates: the valve body 99 that is inserted into the external space side accommodation room opening 903 as the outward opening portion and is movable between the blocked position of blocking the external space side accommodation room opening 903 at the external space side accommodation room opening 903 and the open position of opening the external space side accommodation room opening 903; the spring seat 96 that serves as the urged member, is connected to the valve body 99, is supported by the filter unit housing of the exhaust filter unit 90 movably in the filter unit housing of the exhaust filter unit 90, and guides the movement of the valve body 99; and the spring 97 that serves as the urging member and urges the spring seat 96 as the urged member to move the valve body 99 to the blocked position. The effective area of the filter 95 of the exhaust filter unit 90 is larger than the effective area of the filter 85 of the air supply filter unit 80.

According to this configuration, the effective area of the filter 95 of the exhaust filter unit 90 is larger than the effective area of the filter 85 of the air supply filter unit 80. Consequently, discharge of gas from the substrate storage space 27 through the exhaust filter unit 90 can be facilitated, and replacement can be effectively performed by purge gas injected into the substrate storage space 27 of the container main body 2.

The filter unit housing of the exhaust filter unit 90 accommodates: the valve body 99; the spring seat 96 that serves as the urged member, is connected to the valve body 99, is supported by the filter unit housing of the exhaust filter unit 90 movably in the filter unit housing of the exhaust filter unit 90, and guides the movement of the valve body 99; and the spring 97 that serves as the urging member and urges the spring seat 96 as the urged member to move the valve body 99 to the blocked position. Accordingly, the disposition of the valve body 99 at the blocked position blocks the external space side accommodation room opening 903 with the valve body 99 when the substrate storing container is cleaned with washing water. Consequently, the washing water can be prevented from entering the part of ventilation path that is positioned inward in the filter unit housing with respect to the external space side accommodation room opening 903. As a result, the time period for drying the ventilation path in the filter unit housing can be significantly reduced.

The valve body is made of an elastically deformable material. This configuration allows the external space side accommodation room opening 903 to be securely blocked with the valve body 99.

The valve body 99 is fixed to the spring seat 96 as the urged member in an attachable and detachable manner. According to this configuration, even when the sealing capability by the valve body 99 decreased due to a long term use, the valve body 99 can be easily removed from the spring seat 96 and is replaced with a new valve body 99.

The through-holes 9613 as the gas flow path allowing gas to flow therethrough is formed in the spring seat 96 as the urged member. This configuration allows gas to flow through the spring seat 96.

The urging member is made up of the spring 97. The diameter of the spring 97 is larger than the diameter of the external space side accommodation room opening 903. This configuration can reduce the spring constant as much as possible, and allow the valve body 99 to be moved to the open position with a low pressure.

The nozzle portion 93 as the inner housing portion includes the external space side accommodation room opening 903 as the outward opening portion. This configuration can easily achieve a configuration of including the valve body 99 having the valve body main body 991 for blocking the external space side accommodation room opening 903 of the nozzle portion 93.

The spring seat 96 as the urged member includes the spring seat main body portion 960 as the urged member main body portion including the middle tubular convex portion 963 as the valve body fixation portion to which the valve body 99 is fixed. The nozzle portion 93 as the inner housing portion includes: the tubular portion 931 as the tubular shaped portion including the inner peripheral sliding face on which the spring seat main body portion 960 is slid and the spring seat main body portion 960 is supported; and the external space side accommodation room opening 903 integrally formed with the tubular portion 931. This configuration can easily achieve a configuration of including the valve body 99 that blocks the external space side accommodation room opening 903 of the nozzle portion 93.

As illustrated in FIG. 8, the external space side accommodation room opening 903 has the flared shape having the diameter increasing toward the space outside of the container main body 2. The valve body 99 includes the valve body main body 991 as the through-hole block portion that blocks the external space side accommodation room opening 903 at the blocked position. The outer peripheral face of the valve body main body 991 has the flared shape having the diameter increasing toward the space outside of the container main body 2. The flare rate of the outer peripheral face of the valve body main body 991 in the axial direction of the valve body main body 991 per unit length is higher than the flare rate of the inner peripheral face of the external space side accommodation room opening 903 in the axial direction of the external space side accommodation room opening 903 per unit length.

This configuration allows the lower end portion of the valve body main body 991 to be firmly and securely fixed to the inner peripheral face of the external space side accommodation room opening 903, thereby allowing the external space side accommodation room opening 903 to be securely blocked with the valve body main body 991. As a result, washing water can be securely prevented from entering the part of ventilation path that is positioned inward in the filter unit housing with respect to the external space side accommodation room opening 903.

The substrate storing container 1 includes the filter unit that includes: a ventilation path 210 providing communication between the substrate storage space 27 and the space outside of the container main body 2; and the housing (the inner opening forming portion 91, the first housing portion 92, the nozzle portion 93 and the second housing portion 94) that forms the ventilation path 210. The housing accommodates: the valve body 99 that is inserted into the external space side accommodation room opening 903 as the outward opening portion and is movable between the blocked position of blocking the external space side accommodation room opening 903 at the external space side accommodation room opening 903 and the open position of opening the external space side accommodation room opening 903; the spring seat 96 that serves as the urged member, has the tubular shape, is connected to the valve body 99, supported and guide by the housing movably in the housing, and guides the movement of the valve body 99 so as to move integrally with the valve body 99; and the 97 spring that serves as the urging member and urges the spring seat 96 so as to move the valve body 99 to the blocked position.

This configuration can move the valve body 99 between the blocked position and the open position in a state of stabilizing the axis of the valve body 99. Accordingly, faulty sealing at the valve body 99 can be prevented from occurring. As a result, the purge gas can be prevented from being leaked. The efficiency of discharge of the purge gas can be prevented from decreasing.

According to the configuration described above, a spring having a low spring constant can be used, which reduce the resistance during discharge of purge gas and can increase the gas discharge rate through the exhaust holes 243. As a result, the gas discharge rate through the exhaust holes 243 increases, which can reduce the rate of gas leaking through the sealing member 4 (gasket).

The configuration including the valve body 99 negates the need of providing the outside air side of the filter unit with a filter film or the like for preventing intrusion of water. Accordingly, the resistance of discharge of the purge gas can be made minimum. The discharge rate of the purge gas through the exhaust hole increases, which allows the purge gas to be recovered at an appropriate place, and can maintain the safe operation environment. Water can be prevented from entering the inside of the filter unit during cleaning of the substrate storing container 1, which negates the need to remove and dry the filter unit, and reduce the cleaning time period.

Figure 10:
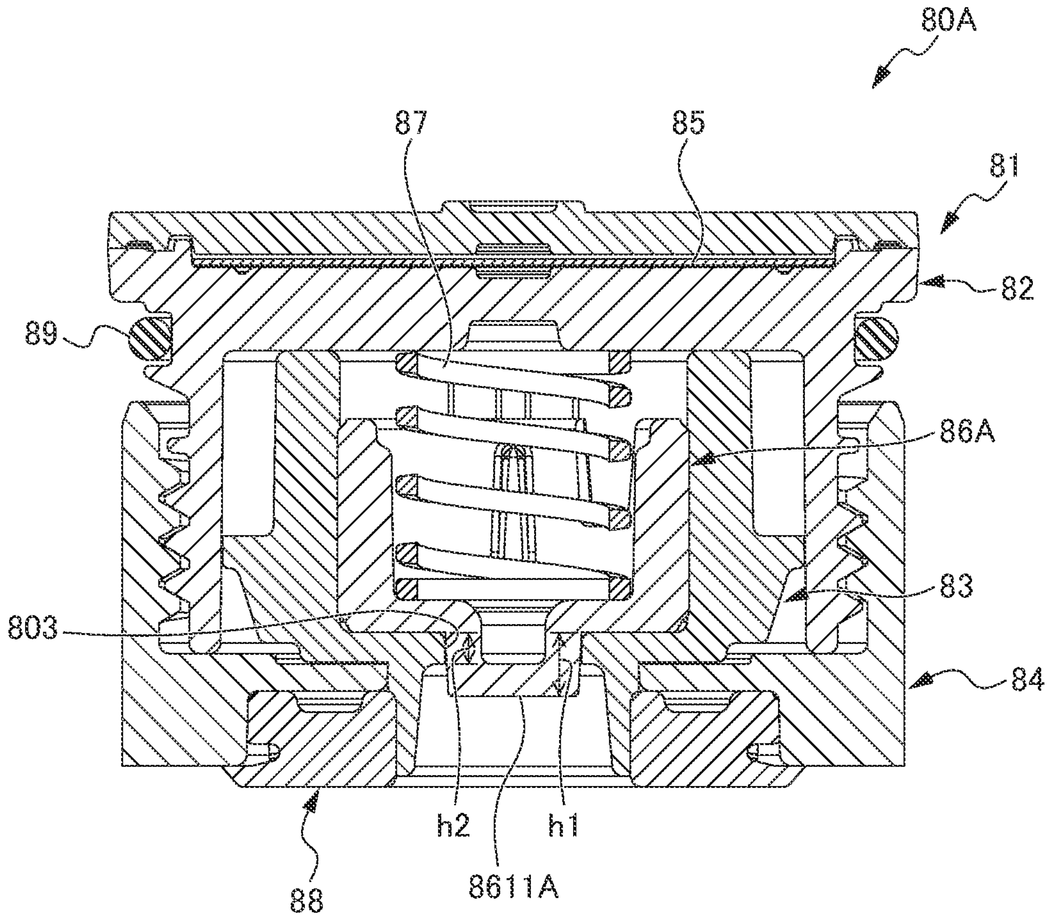
FIG. 10 is a side sectional view illustrating an air supply filter unit 80A of a substrate storing container 1 according to a second embodiment of the present invention.
Figure 11:
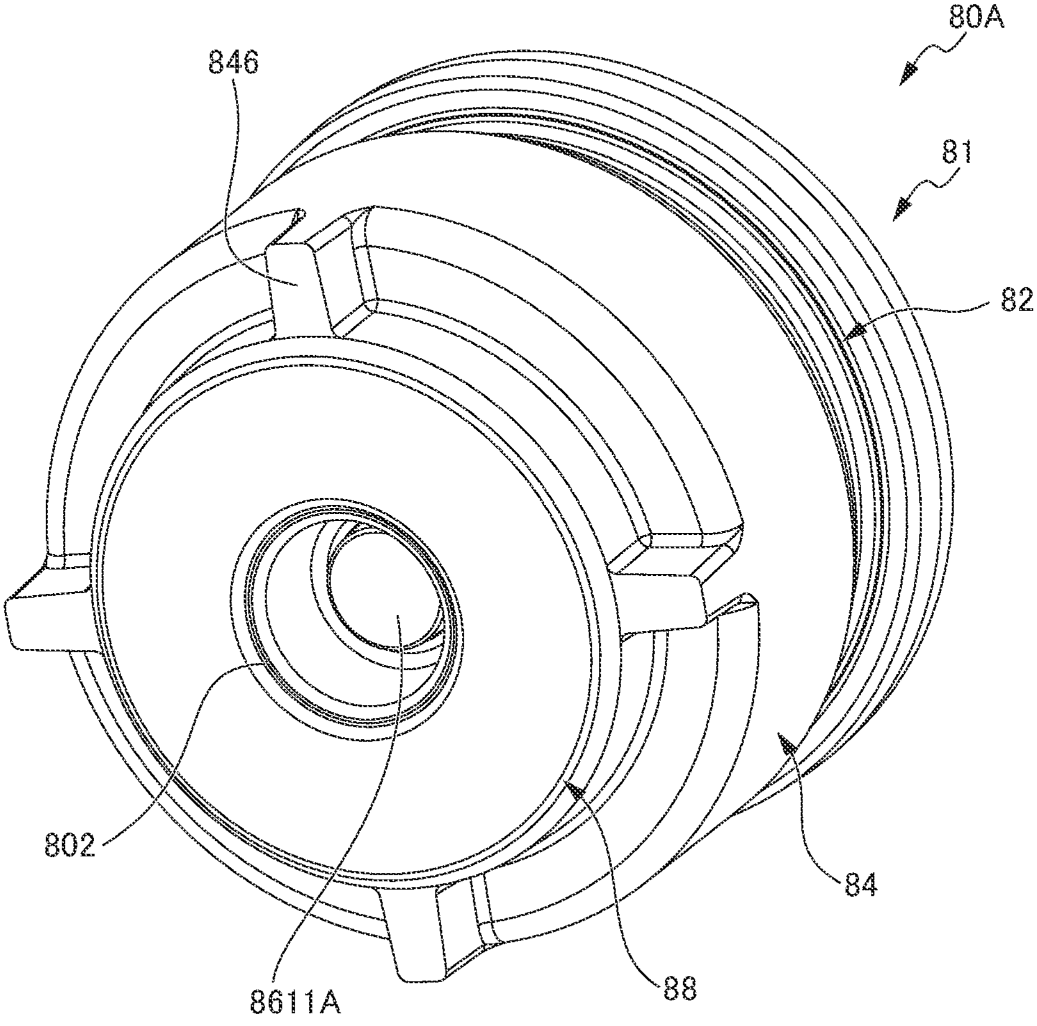
FIG. 11 is a lower perspective view illustrating the air supply filter unit 80A of the substrate storing container 1 according to the second embodiment of the present invention.
Figure 12:
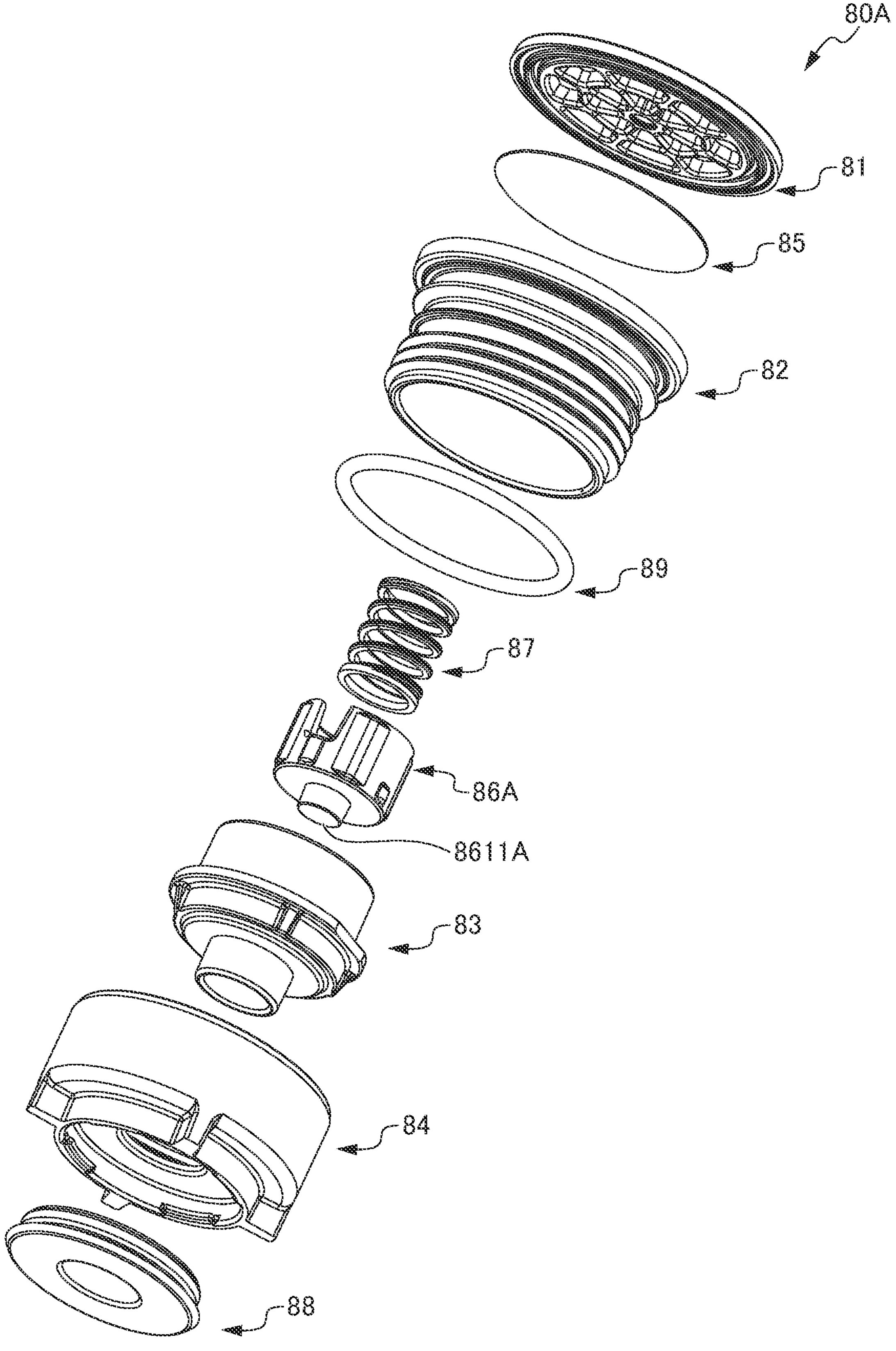
FIG. 12 is an exploded perspective view illustrating the air supply filter unit 80A of the substrate storing container 1 according to the second embodiment of the present invention.

Next, a second embodiment of the present invention will be described with reference to the drawings. FIG. 10 is a side sectional view illustrating an air supply filter unit 80A of the substrate storing container 1. FIG. 11 is a lower perspective view illustrating the air supply filter unit 80A of the substrate storing container 1. FIG. 12 is an exploded perspective view illustrating the air supply filter unit 80A of the substrate storing container 1.

In the second embodiment, the projection length of a convex portion 8611A of a valve body 86A is different from the projection length of the convex portion 8611 of the valve body 86 in the first embodiment. The other components are similar to those in the first embodiment. Accordingly, the same members are assigned the same symbols, and description thereof is omitted.

The height h1 in the projecting direction of the convex portion 8611A is configured to be larger than the length h2 in the penetrating direction of the external space side accommodation room opening 803 as the outward opening portion. Accordingly, the convex portion 8611A projects downward from the external space side accommodation room opening 803 as illustrated in FIGS. 10 and 11.

According to this configuration, even when the valve body 86A is lifted upward in FIG. 10 more than the valve body 86 in the first embodiment, the state where the convex portion 8611A of the valve body 86A is inserted into the external space side accommodation room opening 803 is maintained, thus maintaining the state where the external space side accommodation room opening 803 is blocked. Accordingly, unlike the conventional valve body, occurrence of chattering noise due to repetition of slight opening and closing immediately thereafter in a short time period can be more securely prevented.

Figure 13:
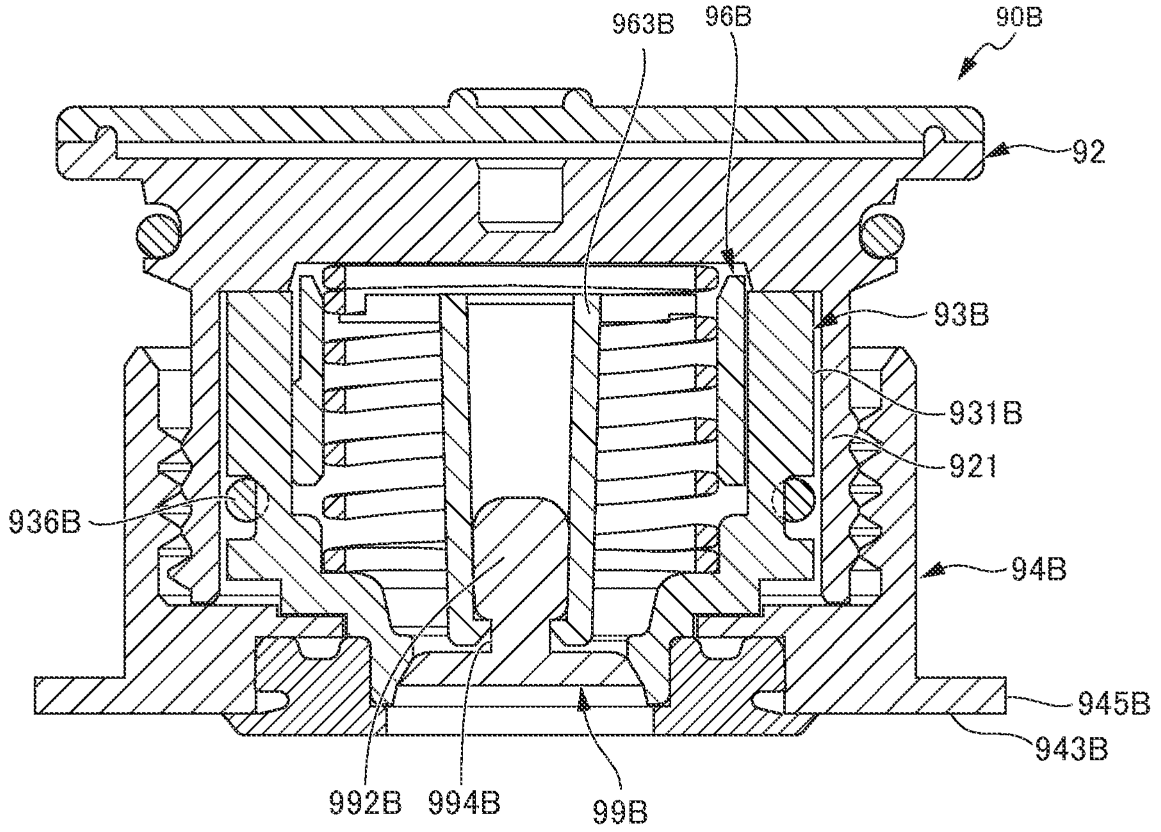
FIG. 13 is a side sectional view illustrating an exhaust filter unit 90B of a substrate storing container 1 according to a third embodiment of the present invention; and storage container

Next, a third embodiment of the present invention will be described with reference to the drawings. FIG. 13 is a side sectional view illustrating an exhaust filter unit 90B.

In the third embodiment, the configurations of a tubular portion 931B of a nozzle portion 93B of an exhaust filter unit 90B, an end axial direction projection portion 943B of a second housing portion 94B, a middle tubular convex portion 963B of a spring seat 96B and a valve body shaft portion 992B are different from the configurations of the tubular portion 931 of the nozzle portion 93, the end axial direction projection portion 943 of the second housing portion 94, the middle tubular convex portion 963 of the spring seat 96 and the valve body shaft portion 992 in the first embodiment. The other components are similar to those in the first embodiment. Accordingly, the same members are assigned the same symbols, and description thereof is omitted.

At a part of the outer peripheral face of the tubular portion 931B of the nozzle portion 93B that is about ⅓ as long as the total length of the tubular portion 931B in the axial direction of the tubular portion 931B from the lower end of the tubular portion 931B in FIG. 13, an annular groove concave over the entire periphery of the tubular portion 931B is formed. An O-ring 936B is provided and fitted into the annular groove. The O-ring 936B abuts against the inner peripheral face of the tubular portion 921 of the first housing portion 92.

The lowermost end portion of the end axial direction projection portion 943B of the second housing portion 94B in FIG. 13 includes a flange portion 945B having an outer diameter increasing outward in the radial direction of the second housing portion 94B.

The middle tubular convex portion 963B of the spring seat 96B projects in the lower direction in FIG. 13 so as to be longer than the end portion of the substantially cylindrical-shaped spring seat main body portion 960B in the axial direction. The upper end portion of the valve body shaft portion 992B is inserted into the lower end portion of the middle tubular convex portion 963B. The lower end portion of the middle tubular convex portion 963B is fitted into the annular groove 994B in the upper end portion of the valve body shaft portion 992B, thereby allowing the valve body 99B to be fixed to the spring seat 96B with a coaxial positional relationship.

Figure 14:
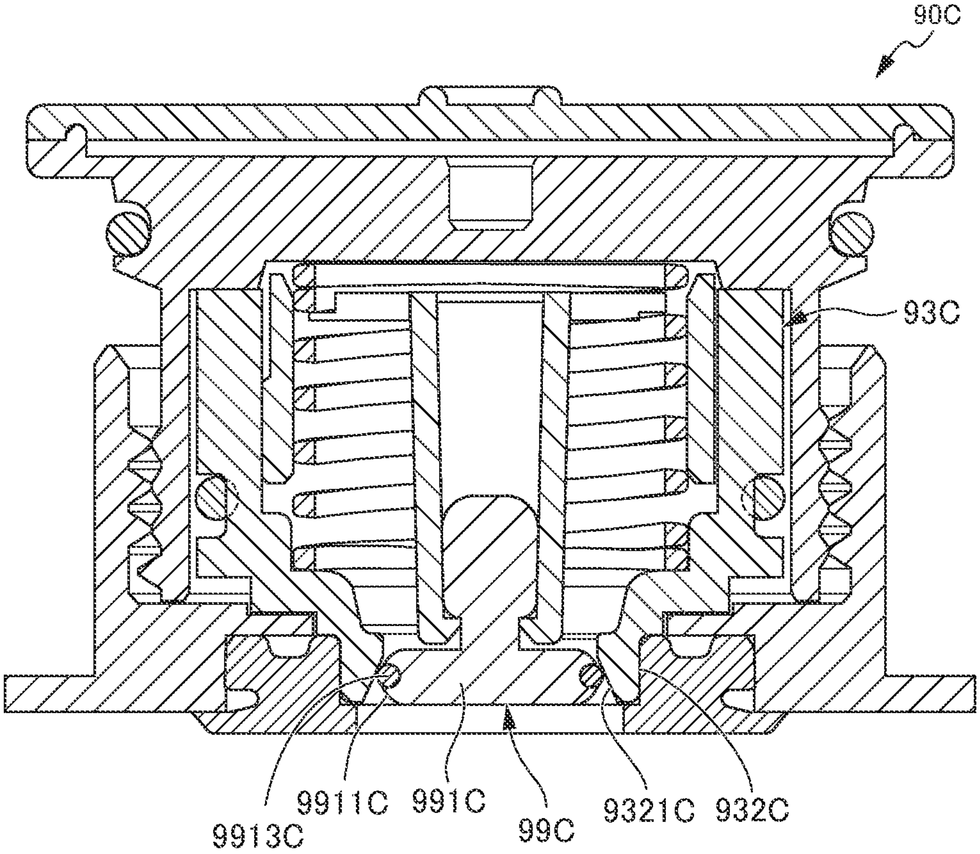
FIG. 14 is a side sectional view illustrating an exhaust filter unit 90C of the substrate storing container 1 according to a fourth embodiment of the present invention.

Next, a fourth embodiment of the present invention will be described with reference to the drawings. FIG. 14 is a side sectional view illustrating an exhaust filter unit 90C.

In the fourth embodiment, the configuration of the valve body 99C of the exhaust filter unit 90C is different from the configuration of the valve body 99B in the third embodiment. The other components are similar to those in the third embodiment. Accordingly, the same members are assigned the same symbols, and description thereof is omitted.

As illustrated in FIG. 14, the circumferential portion of the valve body main body 991C of the valve body 99C includes a middle projection portion 9911C where the middle portion in the upper/lower direction in FIG. 14 projects outward in the radial direction of the valve body main body 991C. The middle projection portion 9911C is provided with an annular groove formed along the entire periphery of the middle projection portion 9911C. The annular groove is provided with an O-ring 9913C fitted thereon. The O-ring 9913C abuts against the flared face 9321C on the inner peripheral face at a part of the external projection portion 932C of the nozzle portion 93C.

As described above, in the present embodiment, the middle projection portion 9911C at the circumferential portion of the valve body main body 991C of the valve body 99C is provided with the O-ring. Accordingly, sealing by the valve body 99C can be more securely performed.

The present invention is not limited to the embodiment described above and can be modified within the technical scope described in the claims.

For example, the configurations of the elements that are the substrate storing container, the air supply filter unit and the exhaust filter unit are not limited to the configurations of the elements that are the substrate storing container 1, the air supply filter unit 80 and the exhaust filter unit 90 in the present embodiment.

The shapes of the container main body and the lid body, the number and dimensions of the substrates that can be stored in the container main body of the present invention are not limited to the shapes of the container main body 2 and the lid body 3 and the number and dimensions of the substrates W that can be stored in the container main body 2 in the present embodiment. The substrate W in the present embodiment is a silicon wafer having a diameter of 300 mm, but the present invention is not limited to this value.

In the present embodiment, the back side substrate support portion has a back side end edge support portion 60 integrally molded with the container main body 2 in the rear end portion of the plate portion 51 of the substrate support plate-like portion 5, but the present invention is not limited to this configuration. For example, the back side substrate support portion may not be integrally molded with the container main body but may be separated from the container main body.

In the present embodiment, the two through-holes in the front of the lower wall 24 are exhaust holes 243 for discharging the gas in the container main body 2 and the two through-holes in the back of the lower wall 24 are air supply holes 242 for supplying gas into the container main body 2, but the present invention is not limited to this configuration. For example, at least one of the two through-holes in the front of the lower wall may be an air supply hole for supplying gas into the container main body.

EXPLANATION OF REFERENCE NUMERALS

1 Substrate storing container
2 Container main body
3 Lid body
4 Sealing member
20 Wall portion

21 Container main body opening portion
27 Substrate storage space
28 Opening circumferential portion
80 Air supply filter unit
81 Inner opening forming portion (housing, filter unit housing, and outer housing portion)
82 First housing portion (housing, filter unit housing, and outer housing portion)
83 Nozzle portion (housing, filter unit housing, and inner housing portion)
84 Second housing portion (housing, filter unit housing, and outer housing portion)
85, 95 Filter
86 Valve body
87, 97 Spring (urging member)
90 Exhaust filter unit
91 Inner opening forming portion (housing, filter unit housing, and outer housing portion)
92 First housing portion (housing, filter unit housing, and outer housing portion)
93 Nozzle portion (housing, filter unit housing, and inner housing portion)
94 Second housing portion (housing, filter unit housing, and outer housing portion)
96 Spring seat (urged member)
99 Valve body
231A, 231B, 241A, 241B Latch engagement concave portion
801, 901 Ventilation path
802, 902 External space side opening
803, 903 External space side accommodation room opening (outward opening portion)
831, 931 Tubular portion (Tubular shaped portion)
834 Large diameter portion bottom portion (valve seat)
860, 860A Valve body main body
861 Sealing wall (sealing portion)
864 Side face convex portion (rib-shaped portion)
960 Spring seat main body portion (urged member main body portion)
8611, 8611A Convex portion
9613 Through-hole (gas flow path)
991 Valve body main body (through-hole block portion)
9913C O-ring
h1, h2 Height
W Substrate

The invention claimed is:

1. A substrate storing container, comprising:
a container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion;
a lid body that can be attached to and detached from the opening circumferential portion, and can block the container main body opening portion in a positional relationship of being surrounded by the opening circumferential portion;
a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body;
a filter unit that includes a ventilation path allowing communication between the substrate storage space and a space outside of the container main body, a filter disposed on the ventilation path and a housing that forms the ventilation path, is disposed in the container main body, and allows gas to pass between the space outside of the container main body and the substrate storage space through the filter; and
an outward opening portion that is included in the housing and is opened toward the space outside of the container main body,
the housing accommodating:
a valve body that is inserted into the outward opening portion and is movable between a blocked position of blocking the outward opening portion and an open position of opening the outward opening portion in this outward opening portion;
an urged member that has a tubular shape, is connected to the valve body, is supported and guided by the housing movably in the housing, and guides movement of the valve body while moving integrally with the valve body so as to move the valve body from the open position to the blocked position; and
an urging member that urges the urged member so as to move the valve body to the blocked position, the urging member having a cylindrical shape,
wherein the valve body is disposed in a vicinity of one end portion of the urging member, and the urged member is disposed in a vicinity of another end portion of the urging member, and
the urged member is disposed such that an outer peripheral face of the urging member slides on a cylindrical inner peripheral face of the urged member from an upper end portion to a lower end portion of the cylindrical inner peripheral face.

2. The substrate storing container according to claim 1, wherein the valve body is made of an elastically deformable material.

3. The substrate storing container according to claim 1, wherein an O-ring is provided on a circumferential portion of the valve body.

4. The substrate storing container according to claim 1, wherein the valve body is fixed to the urged member in an attachable and detachable manner.

5. The substrate storing container according to claim 1, wherein a gas flow path allowing gas to flow therethrough is formed in the urged member.

6. The substrate storing container according to claim 1, wherein the urging member is made up of a spring, and a diameter of the spring is larger than a diameter of the outward opening portion.

7. The substrate storing container according to claim 1, wherein the housing includes:
an outer housing portion; and
an inner housing portion that is disposed in the outer housing portion and is supported by the outer housing portion movably with respect to this outer housing portion, and
the inner housing portion includes the outward opening portion.

8. The substrate storing container according to claim 7, wherein the urged member includes an urged member main body portion that includes a valve body fixation portion to which the valve body is fixed, and the inner housing portion includes:

a tubular shaped portion that includes an inner peripheral sliding face on which the urged member main body portion is slid and this urged member main body portion is supported, and an outward opening portion forming portion integrally formed with the tubular shaped portion.

9. The substrate storing container according to claim 1, wherein the outward opening portion has a flared shape with a diameter increasing toward the space outside of the container main body, the valve body includes a through-hole block portion that blocks the outward opening portion at the blocked position, and an outer peripheral face of the through-hole block portion has a flared shape with a diameter increasing toward the space outside of the container main body, and a flare rate of the outer peripheral face of the through-hole block portion per unit length in an axial direction of the through-hole block portion is higher than a flare rate of the outward opening portion per unit length in an axial direction of the outward opening portion.

10. A filter unit disposed in a container main body of a substrate storing container that comprises: the container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion; and a lid body that can be attached to and detached from the opening circumferential portion, and can block the container main body opening portion in a positional relationship of being surrounded by the opening circumferential portion; and a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body, the filter unit comprising:

a filter disposed on a ventilation path allowing communication between the substrate storage space and a space outside of the container main body; and a housing that forms the ventilation path, an outward opening portion that is included in the housing and is opened toward the space outside of the container main body, the housing accommodating:

a valve body that is inserted into the outward opening portion and is movable between a blocked position of blocking the outward opening portion and an open position of opening the outward opening portion in this outward opening portion;

an urged member that has a tubular shape, is connected to the valve body, is supported and guided by the housing movably in the housing, and guides movement of the valve body while moving integrally with the valve body so as to move the valve body from the open position to the blocked position; and an urging member that urges the urged member so as to move the valve body to the blocked position, the urging member having a cylindrical shape, wherein the valve body is disposed in a vicinity of one end portion of the urging member, and the urged member is disposed in a vicinity of another end portion of the urging member, and the urged member is disposed such that an outer peripheral face of the urging member slides on a cylindrical inner peripheral face of the urged member from an upper end portion to a lower end portion of the cylindrical inner peripheral face.

11. The filter unit according to claim 10, wherein the valve body is made of an elastically deformable material.

12. The filter unit according to claim 10, wherein an O-ring is provided on a circumferential portion of the valve body.

13. The filter unit according to claim 10, wherein the valve body is fixed to the urged member in an attachable and detachable manner.

14. The filter unit according to claim 10, wherein a gas flow path allowing gas to flow therethrough is formed in the urged member.

15. The filter unit according to claim 10, wherein the urging member is made up of a spring, and a diameter of the spring is larger than a diameter of the outward opening portion.

16. The filter unit according to claim 10, wherein the housing includes:

an outer housing portion; and an inner housing portion that is disposed in the outer housing portion and is supported by the outer housing portion movably with respect to this outer housing portion, and the inner housing portion includes the outward opening portion.

17. The filter unit according to claim 16, wherein the urged member includes an urged member main body portion that includes a valve body fixation portion to which the valve body is fixed, and the inner housing portion includes:

a tubular shaped portion that includes an inner peripheral sliding face on which the urged member main body portion is slid and this urged member main body portion is supported, and an outward opening portion forming portion integrally formed with the tubular shaped portion.

18. The filter unit according to claim 10, wherein the outward opening portion has a flared shape with a diameter increasing toward the space outside of the container main body, the valve body includes a through-hole block portion that blocks the outward opening portion at the blocked position, and an outer peripheral face of the through-hole block portion has a flared shape with a diameter increasing toward the space outside of the container main body, and a flare rate of the outer peripheral face of the through-hole block portion per unit length in an axial direction of the through-hole block portion is higher than a flare rate of the outward opening portion per unit length in an axial direction of the outward opening portion.

19. A substrate storing container, comprising:

a container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion;

a lid body that can be attached to and detached from the opening circumferential portion, and can block the container main body opening portion in a positional relationship of being surrounded by the opening circumferential portion;

a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body; and a filter unit that includes a ventilation path allowing communication between the substrate storage space and a space outside of the container main body, a filter disposed on the ventilation path and a housing that forms the ventilation path, is disposed in the container main body, and allows gas to pass between the space outside of the container main body and the substrate storage space through the filter, the filter unit including: an exhaust filter unit that allows gas to flow from the substrate storage space to the space outside of the container main body; and an air supply filter unit that allows gas to flow from the space outside of the container main body to the substrate storage space, the housing of the exhaust filter unit including an outward opening portion opened toward the space outside of the container main body, the housing of the exhaust filter unit accommodating:

a valve body that is inserted into the outward opening portion and is movable between a blocked position of blocking the outward opening portion and an open position of opening the outward opening portion in this outward opening portion;

an urged member that has a tubular shape, is connected to the valve body, is supported and guided by the housing of the exhaust filter unit movably in the housing of the exhaust filter unit, and guides movement of the valve body while moving integrally with the valve body so as to move the valve body from the open position to the blocked position; and an urging member that urges the urged member so as to move the valve body to the blocked position, the urging member having a cylindrical shape, wherein the valve body is disposed in a vicinity of one end portion of the urging member, and the urged member is disposed in a vicinity of another end portion of the urging member, the urged member is disposed such that an outer peripheral face of the urging member slides on a cylindrical inner peripheral face of the urged member from an upper end portion to a lower end portion of the cylindrical inner peripheral face, and an effective area of the filter of the exhaust filter unit is larger than an effective area of the filter of the air supply filter unit.

20. The substrate storing container according to claim 19, wherein the valve body is made of an elastically deformable material.

21. The substrate storing container according to claim 19, wherein the valve body is fixed to the urged member in an attachable and detachable manner.

22. The substrate storing container according to claim 19, wherein a gas flow path allowing gas to flow therethrough is formed in the urged member.

23. The substrate storing container according to claim 19, wherein the urging member is made up of a spring, and a diameter of the spring is larger than a diameter of the outward opening portion.

24. The substrate storing container according to claim 19, wherein the housing includes:

an outer housing portion; and an inner housing portion that is disposed in the outer housing portion and is supported by the outer housing portion movably with respect to this outer housing portion, and the inner housing portion includes the outward opening portion.

25. The substrate storing container according to claim 24, wherein the urged member includes an urged member main body portion that includes a valve body fixation portion to which the valve body is fixed, and the inner housing portion includes:

a tubular shaped portion that includes an inner peripheral sliding face on which the urged member main body portion is slid and this urged member main body portion is supported, and an outward opening portion forming portion integrally formed with the tubular shaped portion.

26. The substrate storing container according to claim 19, wherein the outward opening portion has a flared shape with a diameter increasing toward the space outside of the container main body, the valve body includes a through-hole block portion that blocks the outward opening portion at the blocked position, and an outer peripheral face of the through-hole block portion has a flared shape with a diameter increasing toward the space outside of the container main body, and a flare rate of the outer peripheral face of the through-hole block portion per unit length in an axial direction of the through-hole block portion is higher than a flare rate of the outward opening portion per unit length in an axial direction of the outward opening portion.

27. A substrate storing container, comprising:

a container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion;

a lid body that can be attached to and detached from the opening circumferential portion, and can block the container main body opening portion in a positional relationship of being surrounded by the opening circumferential portion;

a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body;

a filter unit that includes a ventilation path allowing communication between the substrate storage space and a space outside of the container main body, a filter disposed on the ventilation path and a housing that forms the ventilation path, is disposed in the container main body, and allows gas to pass between the space outside of the container main body and the substrate storage space through the filter; and an outward opening portion that is included in the housing and is opened toward the space outside of the container main body, the housing accommodating a valve body that blocks the outward opening portion by being inserted into this outward opening portion, and opens the outward opening portion by being taken out and removed from this outward opening portion, wherein the valve body is connected to an urged member that has a tubular shape and guides movement of the valve body, the urged member is supported and guided by the housing movably in the housing and guides the movement of the valve body while moving integrally with the valve body so as to move the valve body from the open position to the blocked position, the valve body is disposed in a vicinity of one end portion of the urging member, and the urged member is disposed in a vicinity of another end portion of the urging member, and the urged member is disposed such that an outer peripheral face of the urging member slides on a cylindrical inner peripheral face of the urged member from an upper end portion to a lower end portion of the cylindrical inner peripheral face.

28. The substrate storing container according to claim 27 wherein an opening area of the ventilation path at an opening end thereof opening toward the space outside of the container main body is larger than an opening area at the outward opening portion into which the valve body is inserted.

29. The substrate storing container according to claim 27, wherein the housing includes:

an outer housing portion; and an inner housing portion that is disposed in the outer housing portion and is supported by the outer housing portion movably with respect to this outer housing portion, and the inner housing portion includes the outward opening portion.

30. The substrate storing container according to claim 29, wherein the valve body includes a valve body main body, and a convex portion that projects from the valve body main body and is inserted into the outward opening portion.

31. The substrate storing container according to claim 30, wherein a part of the valve body main body around the convex portion constitutes a sealing portion, the inner housing portion includes a tubular shaped portion that includes an inner peripheral sliding face on which the valve body main body is slide to support the valve body main body, and a part of the inner housing portion around the outward opening portion constitutes a valve seat against which the sealing portion abuts.

32. The substrate storing container according to claim 31, where a height of the convex portion in a projecting direction is identical to a length of the outward opening portion in a penetrating direction thereof or larger than a length of the outward opening portion in the penetrating direction.

33. The substrate storing container according to claim 31, wherein the valve body main body includes a rib-shaped portion that directly abuts against and is slid on the inner peripheral sliding face.

34. The substrate storing container according to claim 27, wherein the filter unit includes an urging member that urges the valve body in a direction of insertion into the outward opening portion.

35. A filter unit for use in a container main body of a substrate storing container that comprises: the container main body that includes: a tubular wall portion that includes an opening circumferential portion provided with a container main body opening portion formed at one end portion, with another end portion being blocked; and a substrate storage space that is made of an inner face of the wall portion, can store a substrate and communicates with the container main body opening portion; and a lid body that can be attached to and detached from the opening circumferential portion, and can block the container main body opening portion in a positional relationship of being surrounded by the opening circumferential portion; and a sealing member that is attached to the lid body, can abut against the lid body and the opening circumferential portion, and blocks, together with the lid body, the container main body opening portion, by being interposed between the opening circumferential portion and the lid body and being in close contact with and abutting against the opening circumferential portion and the lid body, the filter unit comprising:

a filter disposed on a ventilation path allowing communication between the substrate storage space and a space outside of the container main body;

a housing that forms the ventilation path; and an outward opening portion that is included in the housing and is opened toward the space outside of the container main body, wherein the housing accommodates a valve body that blocks the outward opening portion by being inserted into this outward opening portion, and opens the outward opening portion by being taken out and removed from this outward opening portion, the valve body is connected to an urged member that has a tubular shape and guides movement of the valve body, the urged member is supported and guided by the housing movably in the housing and guides the movement of the valve body while moving integrally with the valve body so as to move the valve body from the open position to the blocked position, the valve body is disposed in a vicinity of one end portion of an urging member having a cylindrical shape, and the urged member is disposed in a vicinity of another end portion of the urging member, the urged member is disposed such that an outer peripheral face of the urging member slides on a cylindrical inner peripheral face of the urged member from an upper end portion to a lower end portion of the cylindrical inner peripheral face, and gas can pass between the space outside of the container main body and the substrate storage space through the filter.

36. The filter unit according to claim 35 wherein an opening area of the outward opening portion at an opening end thereof opening toward the space outside of the container main body is larger than an opening area at the outward opening portion into which the valve body is inserted.

37. The filter unit according to claim 35, wherein the housing includes:

an outer housing portion; and an inner housing portion that is disposed in the outer housing portion and is supported by the outer housing portion movably with respect to this outer housing portion, and the inner housing portion includes the outward opening portion.

38. The filter unit according to claim 37, wherein the valve body includes a valve body main body, and a convex portion that projects from the valve body main body and is inserted into the outward opening portion.

39. The filter unit according to claim 38, wherein a part of the valve body main body around the convex portion constitutes a sealing portion, the inner housing portion includes a tubular shaped portion that includes an inner peripheral sliding face on which the valve body main body is slide to support the valve body main body, and a part of the inner housing portion around the outward opening portion constitutes a valve seat against which the sealing portion abuts.

40. The filter unit according to claim 39, where a height of the convex portion in a projecting direction is identical to a length of the outward opening portion in a penetrating direction thereof or larger than the length of the outward opening portion in the penetrating direction.

41. The filter unit according to claim 39, wherein the valve body main body includes a rib-shaped portion that directly abuts against and is slid on the inner peripheral sliding face.

42. The filter unit according to claim 35, wherein the filter unit includes an urging member that urges the valve body in a direction of insertion into the outward opening portion.

* * * * *